US012672512B2

(12) United States Patent
Chiu et al.

(10) Patent No.: US 12,672,512 B2
(45) Date of Patent: Jun. 30, 2026

(54) SUPPORTING STRUCTURE AND INSPECTION EQUIPMENT THEREFOF AND CALIBRATING TOOL FOR INSPECTION EQUIPMENT

(71) Applicant: Gudeng Precision Industrial Co., Ltd., New Taipei City (TW)

(72) Inventors: Ming-Chien Chiu, New Taipei City (TW); Yung-Chin Pan, New Taipei City (TW); Tzu-Ning Huang, New Taipei City (TW)

(73) Assignee: GUDENG PRECISION INDUSTRIAL CO., LTD., New Taipei City (TW)

( * ) Notice: Subject to any disclaimer, the term of this patent is extended or adjusted under 35 U.S.C. 154(b) by 382 days.

(21) Appl. No.: 18/519,636

(22) Filed: Nov. 27, 2023

(65) Prior Publication Data

US 2024/0412996 A1    Dec. 12, 2024

Related U.S. Application Data

(60) Provisional application No. 63/472,429, filed on Jun. 12, 2023.

(51) Int. Cl.
*H10P 72/30*        (2026.01)
*H10P 74/20*        (2026.01)

(52) U.S. Cl.
CPC ........ *H10P 72/3402* (2026.01); *H10P 74/203* (2026.01)

(58) Field of Classification Search
CPC ............... H10P 72/3402; H10P 74/203; H10P 72/0616; H10P 72/0606; H10P 72/10;
(Continued)

(56) References Cited

U.S. PATENT DOCUMENTS

| | | | | |
|---|---|---|---|---|
| 5,706,946 A | * | 1/1998 | Kakizaki ................. | H10P 72/15 206/711 |
| 10,811,291 B2 | * | 10/2020 | Liu .......................... | H10P 72/19 |
| 2014/0231370 A1 | * | 8/2014 | Han ....................... | F16M 13/00 211/41.1 |

FOREIGN PATENT DOCUMENTS

| | | | | |
|---|---|---|---|---|
| CN | 108122815 A | * | 6/2018 | .............. H10P 72/18 |
| CN | 110610885 A | * | 12/2019 | .............. H10P 72/15 |

(Continued)

*Primary Examiner* — Fatemeh Esfandiari Nia
(74) *Attorney, Agent, or Firm* — WPAT, PC

(57) ABSTRACT

A supporting structure and an inspection equipment thereof and a calibrating tool for the inspection equipment include backbone and parallel blocks in the supporting structure. The receiving trench is defined between two adjacent supporting portions on the backbone for receiving supporter. Each supporting portion has a first limiting portion and the supporter has a second limiting portion. The parallel block is disposed between the first and the second limiting portion to restrain relative movement of the supporter. The inspection equipment is used for inspecting the supporting structure and includes plural inspection regions for inspecting the deviation amount of the supporter based on how much the moving door travels towards the substrate carrier. The calibrating tool is used for calibrating the inspection equipment. Whether the inspection surface conforms with a calibration condition is inspected through the inspection regions based on how much the moving door travels toward the calibrating tool.

20 Claims, 25 Drawing Sheets

(58) Field of Classification Search
CPC ...... H10P 74/20; H10P 74/23; H10P 72/7624;
H10P 72/1908; H10P 72/1921; H10P
72/50
See application file for complete search history.

(56) References Cited

FOREIGN PATENT DOCUMENTS

| | | | | | |
|---|---|---|---|---|---|
| JP | 2011041608 | A | * | 3/2011 | |
| JP | 2013119430 | A | * | 6/2013 | |
| JP | 5781909 | B2 | * | 9/2015 | |
| KR | 102034288 | B1 | * | 10/2019 | ....... H01L 21/67259 |

* cited by examiner

SUPPORTING STRUCTURE AND INSPECTION EQUIPMENT THEREFOF AND CALIBRATING TOOL FOR INSPECTION EQUIPMENT

RELATED APPLICATIONS

This application claims priority to U.S. Provisional Patent Application, No. 63/472,429, titled "The Adjustment Mechanism of The Central Beam in The Substrate Carrier and The Inspection Device Thereof," filed on Jun. 12, 2023, which is hereby incorporated by reference in their entirety.

BACKGROUND OF THE INVENTION

Technical Field

The invention relates to a supporting structure and an inspection equipment thereof and a calibrating tool for the inspection equipment. More particularly, to a supporting structure and an inspection equipment thereof and a calibrating tool for the inspection equipment for use in semiconductor manufacturing process.

Description of Related Art

In the semiconductor industry nowadays, the technology of storing and transporting semiconductor components like wafers, reticles, semiconductor substrates or the like plays an important role. Especially with the increment in substrate sizes, an effective supporting mechanism during storing or transporting the substrates is needed to prevent collisions and damages on the substrates.

Currently, a kind of central supporting mechanism used in the substrate containers is developed. However, assembly tolerance often appears due to the assembling method of the central supporting mechanism, resulting in problems like shifting or tilting the central supporting elements. Further, during transportation of the substrate containers, vibrations may occur, and the central supporting elements may shift or tilt easily as they are supporting the substrates, especially after repeated use over time. The central supporting element may collide with the substrate and consequently damage the substrate. There are currently no effective mechanisms to prevent the central supporting elements from shifting or tilting and no effective method to detect the deviation amount of the central supporting elements.

Therefore, how to effectively inspect the deviation amount of the central supporting element and prevent it from shifting or tilting is a major problem needed to be solved for the industry.

SUMMARY

In view of the above-mentioned problems, the present invention is to provide a supporting structure and an inspection equipment thereof and a calibrating tool for the inspection equipment. The supporters are connected to the backbone through several different elements, so the supporters can be fixed properly and the problems like tilting or shifting of the supporters can be prevented. Further, a subtle adjustment can be applied to the deviation amount of the supporter through. On the other hand, the supporting structure can be inspected by the inspection equipment before practically used to support the substrates, so whether the deviation range of the supporter conforms with a standard or not can be determined. Moreover, a standardized calibration can be performed on the inspection equipment through the calibrating tool, so as to check whether the specification or size of the inspection equipment is correct or not.

According to one aspect of the invention, a supporting structure for using in a substrate carrier is provided. The supporting structure includes a backbone and plural parallel blocks. The backbone is vertically disposed in the substrate carrier and has plural supporting portions that are equal-distantly arranged on the backbone. A receiving trench is defined between two adjacent supporting portions for receiving a supporter. Each supporting portion is provided with a first limiting portion and the supporter is provided with a second limiting portion corresponding to the first limiting portion. The parallel blocks are each disposed between the first limiting portion and the second limiting portion to restrain a relative movement of the supporter in the receiving trench to the supporting portion.

In one embodiment, the first limiting portion and the second limiting portion match with each other and a parallel slot is defined therebetween. Each parallel block is structurally fitted and disposed in the parallel slot.

In another embodiment, the supporting structure further includes plural stress blocks. Each stress block is disposed between the receiving trench and the supporter, and each stress block is configured for adjusting a first shifting amount of the supporter in the receiving trench.

In yet another embodiment, each stress block includes a wedge body and a protruded bump. The wedge body has a clamping surface for pressing against a beveled surface of the supporter. The protruded bump is located at an edge of the clamping surface. Each stress block fixes the supporter via the clamping surface and the protruded bump.

In one embodiment, a guide angle is provided at a location where the clamping surface connects to the protruded bump. The guide angle matches a contour of a corner of the supporter, thereby having the stress block in close contact with the supporter.

In another embodiment, the supporting structure further includes a first locking member passing through the backbone and locking with the stress block. The first shifting amount of the supporter in a first horizontal direction of the backbone is determined by how much the first locking member locks with the stress block.

In yet another embodiment, the supporting structure further includes plural adjusting blocks that each comprises a trapezoid body which has an upper inclined surface for pressing against the supporter.

In one embodiment, the adjusting blocks are disposed on a lateral side of the supporting portion, and each adjusting block is configured for pressing against the supporter for adjusting a second shifting amount of the supporter.

In another embodiment, the supporting structure further includes a second locking member passing through the backbone and locking with the adjusting block. The second shifting amount of the supporter in a second horizontal direction of the backbone is determined by how much the second locking member locks with the adjusting block.

In yet another embodiment, an upper groove and a lower groove are respectively provided on a top end and a bottom end of the backbone, and the supporting structure further includes an upper fixing block and a lower fixing block. The upper fixing block is at the top end for coupling with the upper groove, and the backbone is connected to a top portion of the substrate carrier through the top end and upper fixing block. The lower fixing block is at the bottom end for coupling with the lower groove, and the backbone is connected to a bottom portion of the substrate carrier through the bottom end and the lower fixing block.

According to another aspect of the invention, an inspection equipment for inspecting the previously described supporting structure and for using with the substrate carrier in the above embodiments is provided. The inspection equipment includes a platform, a moving door, and an inspection member. The platform is used for supporting the substrate carrier. The moving door is movably disposed on the platform for moving toward and away from the substrate carrier. The inspection member is disposed on the moving door, and the inspection member includes an inspection surface for abutting against the supporter and plural inspection regions. A deviation amount of the supporter is inspected by the inspection regions based on how much the moving door travels toward the substrate carrier.

In one embodiment, the deviation amount includes a multi-axial deviation amount of the supporter received in the receiving trench.

In another embodiment, the inspection regions include a first inspection region and a second inspection region located inside the first inspection region. When the moving door stops at a first inspection location on the platform, the supporter has a first deviation amount larger than an inspection range. When the moving door stops at a second inspection location on the platform, the supporter has a second deviation amount smaller than or equal to the inspection range.

In yet another embodiment, the inspection regions further include a third inspection region located inside the second inspection region. When the moving door stops at a third inspection location on the platform, the supporter has a third deviation amount conforms with a calibration condition. The third deviation amount is smaller than the second deviation amount.

In one embodiment, the inspection equipment further includes a travel depth indication block which is disposed on the moving door and configured for indicating an inspection result of the inspection member. The deviation amount of the supporter is indicated by the travel depth indication block based on how much the moving door travels toward the substrate carrier.

In another embodiment, the inspection equipment further includes a gap detector which is disposed on the moving door for detecting an oblique state of the substrate carrier.

According to yet another aspect of the invention, a calibrating tool for calibrating the inspection equipment is provided. The calibrating tool includes a bae and a vertical stand. The base sits on the platform of the inspection equipment. The vertical stand is disposed uprightly on the base and has plural calibration members that are equal-distantly arranged on the vertical stand for abutting against the inspection surface of the inspection member. The calibration members have a structure which is the same as the supporters. Each said supporter is received in the receiving trench, thereby having the supporters equal-distantly disposed on the backbone. Whether the inspection surface conforms with a calibration condition or not is inspected through the inspection regions of the inspection member based on how much the moving door travels toward the calibrating tool.

In one embodiment, the inspection regions include: a first inspection region, a second inspection region, and a third inspection region. The first inspection region is used for defining a first deviation amount which is larger than a calibration range. The second inspection region is located inside the first inspection region for defining a second deviation amount which is larger than the calibration range. The third inspection region is located inside the second inspection region for defining a third deviation amount smaller than or equal to the calibration range. The third deviation amount is smaller than the second deviation amount, and the second deviation amount is smaller than the first deviation amount. When the inspection surface deviates beyond the calibration range, the moving door stops at a first inspection location or a second inspection location on the platform and thereby indicating that the inspection surface does not meet the calibration condition. When the inspection surface deviates in the calibration range, the moving door stops at a third inspection location on the platform and thereby indicating that the inspection surface conforms with the calibration condition.

In another embodiment, the calibrating tool further includes a handle disposed on the base for operated by an external device to lift the calibrating tool.

In yet another embodiment, the calibrating tool further includes a supporting stand disposed on the base and connecting to two opposite sides of the vertical stand for providing support to the vertical stand.

According to the disclosure of the embodiments of the invention, the parallel block is used to restrain the movement of the supporter in relation to the receiving trench. In some embodiments, the stress block and the adjusting block are used to fix the supporter and subtly adjust the deviation amount of the supporter to solve the problem of shifting or tilting of the supporter. On the other hand, before practically used to support the substrates, the supporters can be inspected by the inspection equipment to determine if the deviation amount of the supporter conforms with a standard or not. When the deviation of the supporter is inspected, its deviation amount can be adjusted to achieve the function of calibration. Furthermore, prior to the inspection, a standardized calibration can be performed on the inspection equipment to check whether the specification or size of the inspection equipment is correct or not.

BRIEF DESCRIPTION OF DRAWINGS

The invention can be more fully understood by reading the following detailed description of the embodiment, with reference made to the accompanying drawings as follows:

FIG. 5*a* is an exploded diagram of a backbone, a stress block, and a first locking member;

DETAILED DESCRIPTION

The supporting structure and the inspection equipment for inspecting the supporting structure, and the calibrating tool for the inspection equipment of the embodiments of the invention, use parallel block to fix and position the supporters. Before putting to practical use of supporting the substrates, the supporting structure can be inspected by the inspection equipment to determine whether a deviation range thereof matches a standard or not. A standardized calibration can be performed on the inspection equipment through the calibrating tool, to check whether the specification or size of the inspection equipment is correct, and to check if its deviation amount is in a calibration range.

Figure 1:
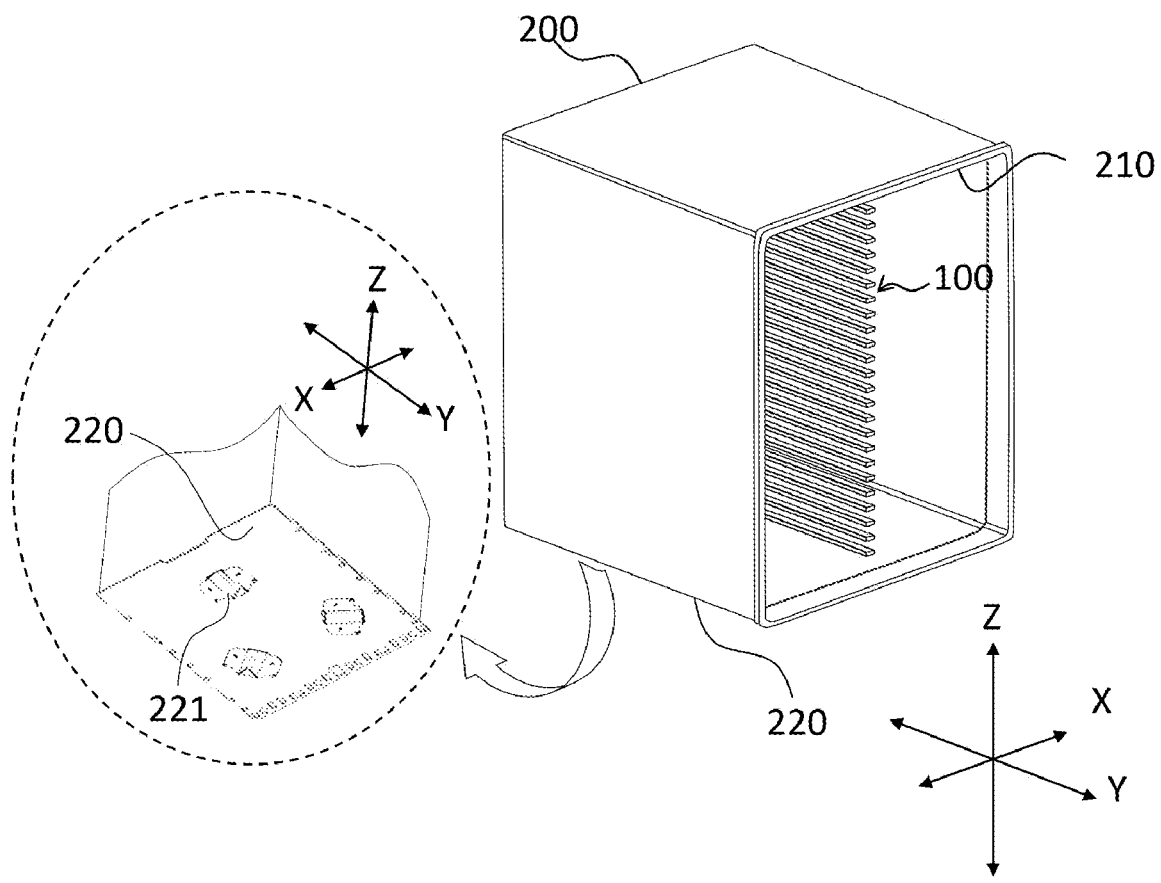
FIG. 1 is a three-dimensional diagram of a supporting structure installed inside a substrate carrier according to one embodiment of the invention.
Figure 2:
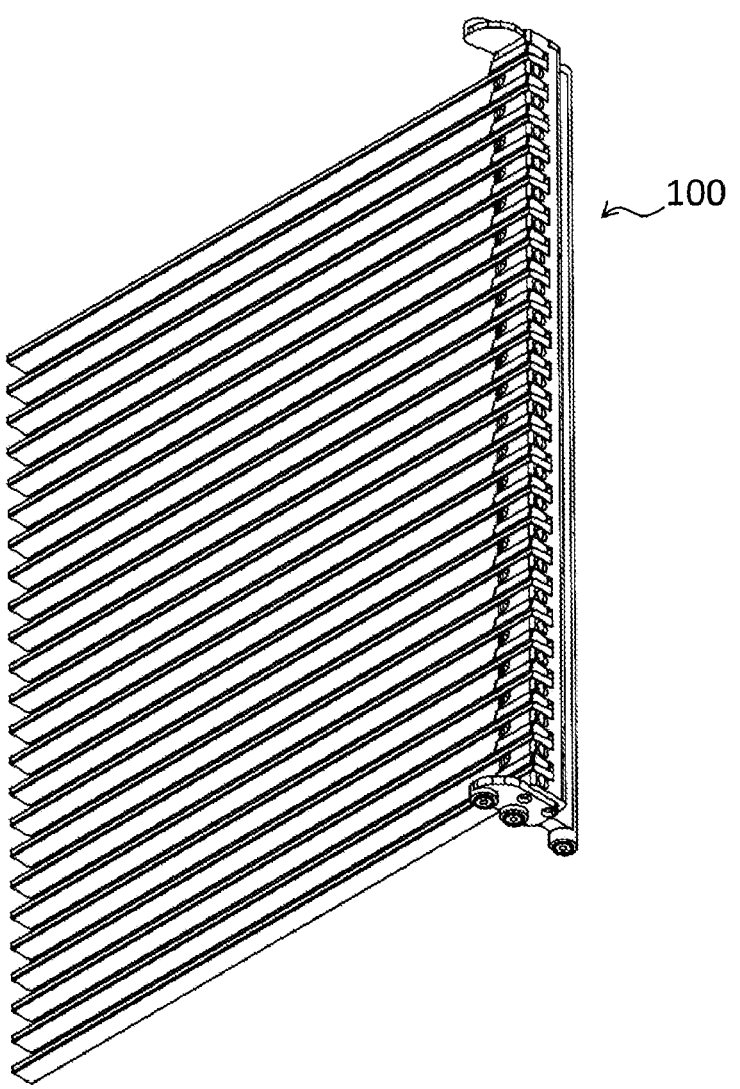
FIG. 2 is a three-dimensional diagram of a supporting structure according to one embodiment of the invention.
Figure 3:
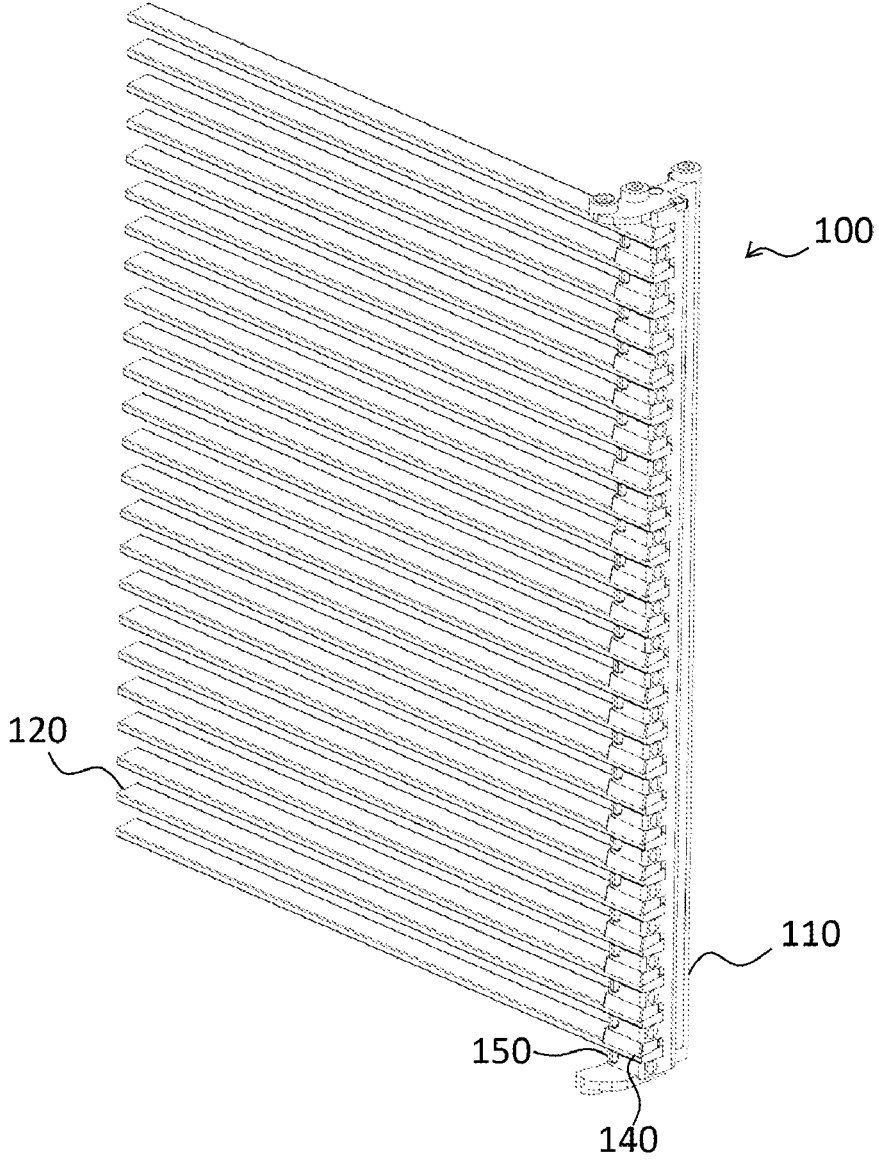
FIG. 3 is a three-dimensional diagram of the supporting structure from another view angle.

Please refer to FIG. 1 to FIG. 3. FIG. 1 is a three-dimensional diagram of a supporting structure installed inside a substrate carrier according to one embodiment of the invention. FIG. 2 is a three-dimensional diagram of a supporting structure according to one embodiment of the invention. FIG. 3 is a three-dimensional diagram of the supporting structure from another view angle. The supporting structure 100 of the present embodiment is implemented in a substrate carrier 200 for supporting multiple semiconductor substrates in the substrate carrier 200, so the substrates are prevented from colliding with each other. The substrate carrier 200, for example, is used to contain multiple large wafers or PCBs. These large substrates require a stricter requirement regarding the deviation amount of the supporting structure 100 in the substrate carrier 200.

Figure 4:
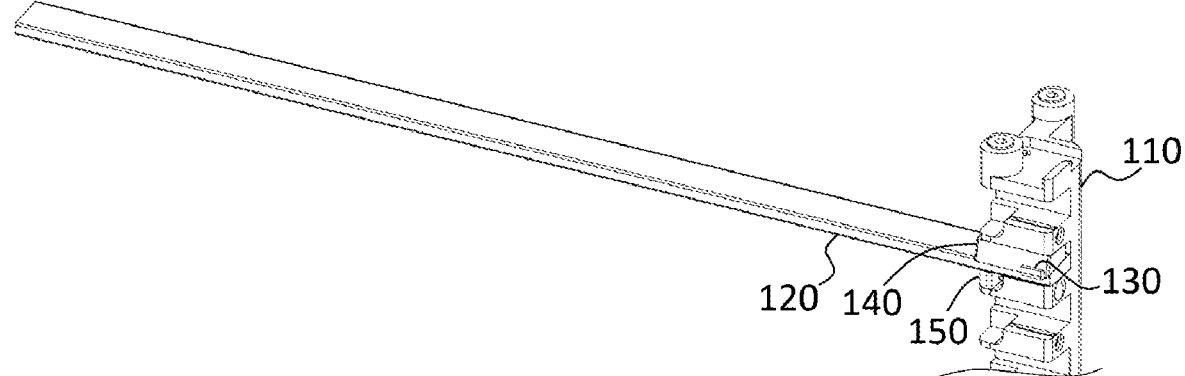
FIG. 4 is a partial three-dimensional diagram of the supporting structure.
Figure 5B:
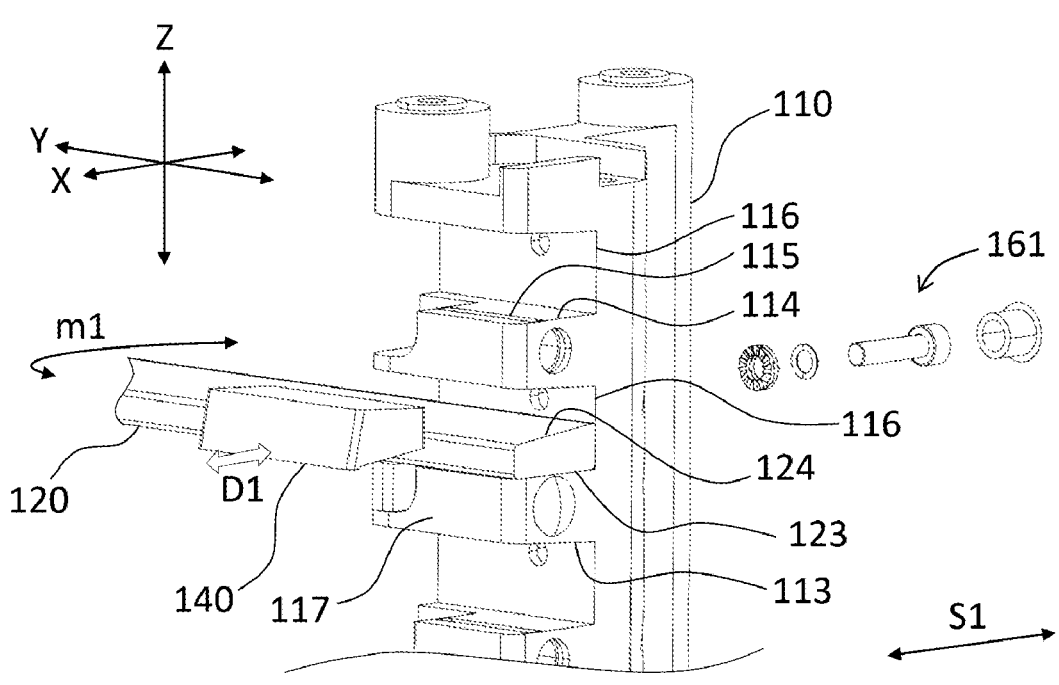
FIG. 5*b* is a partial cross-sectional diagram of the backbone, the stress block, and the supporters.
Figure 5B:
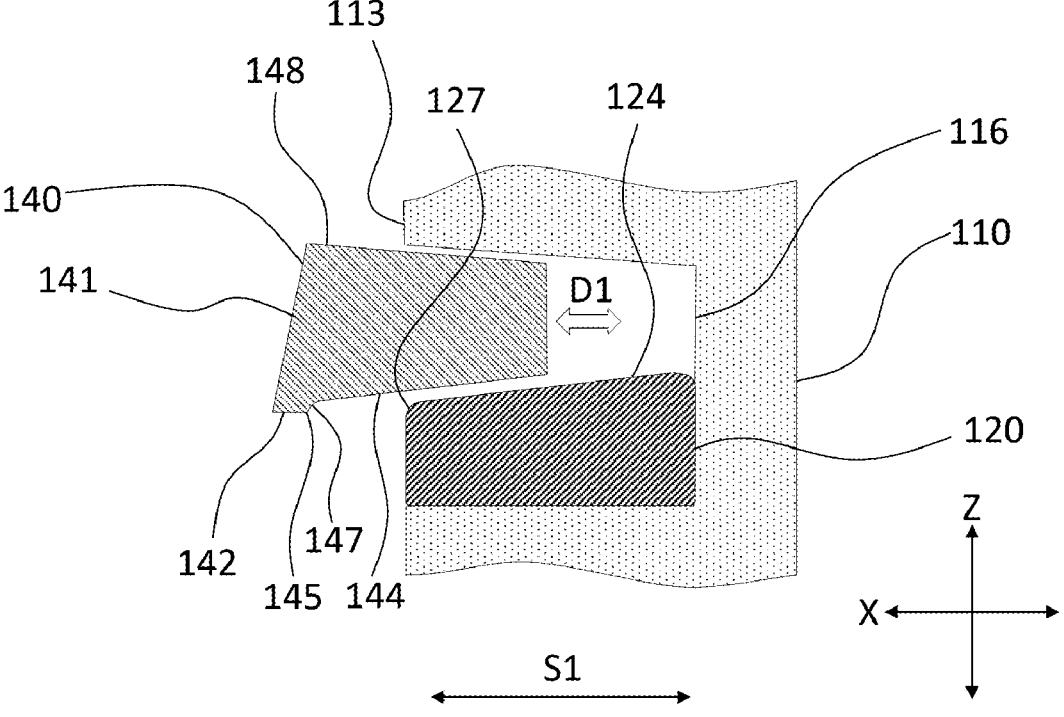
Figure 6A:
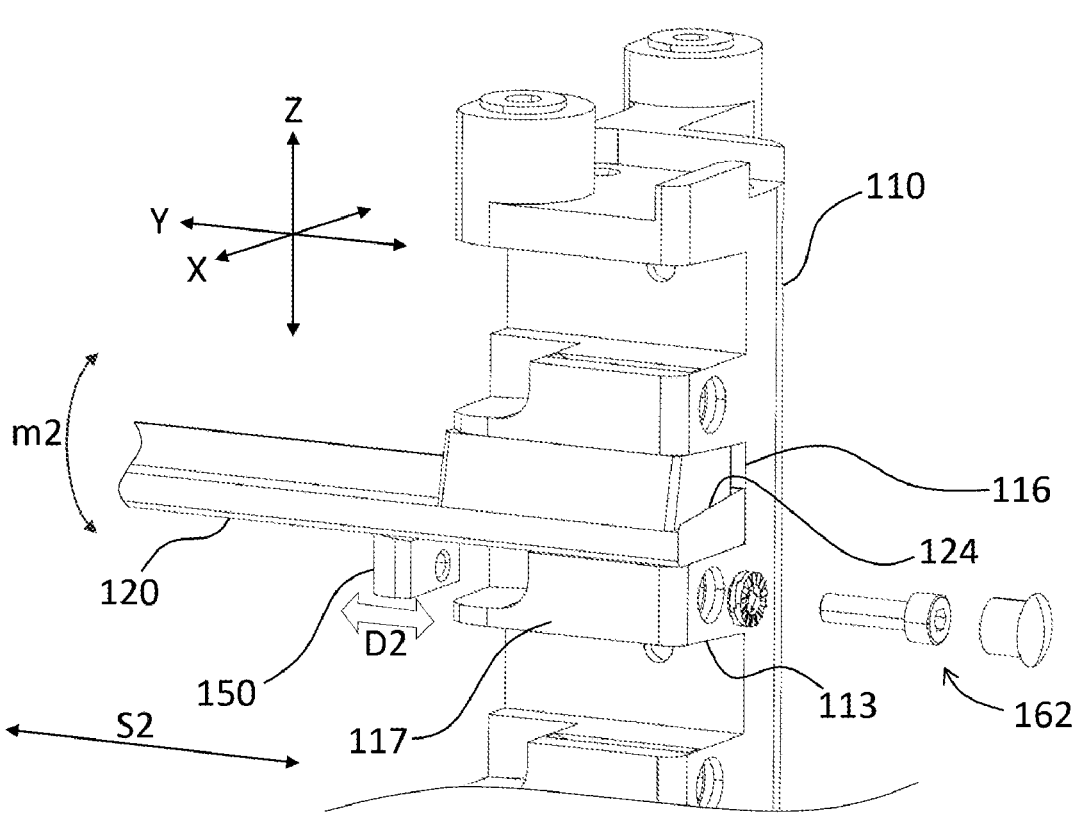
FIG. 6*a* is an exploded diagram of the backbone, an adjusting block, and a second locking member.
Figure 6B:
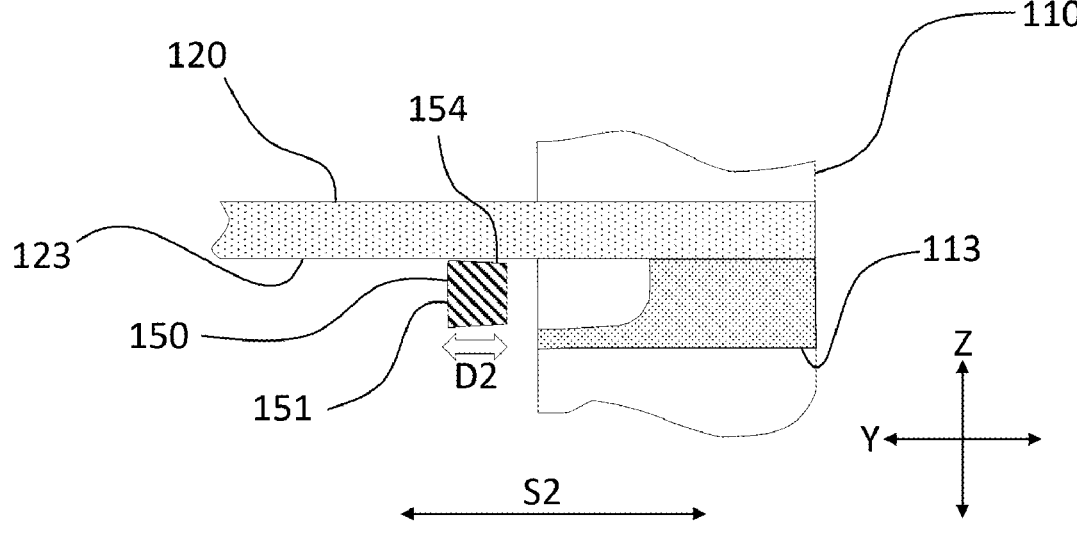
FIG. 6*b* is a partial cross-sectional diagram of the backbone, the adjusting block, and the supporters.
Figure 7:
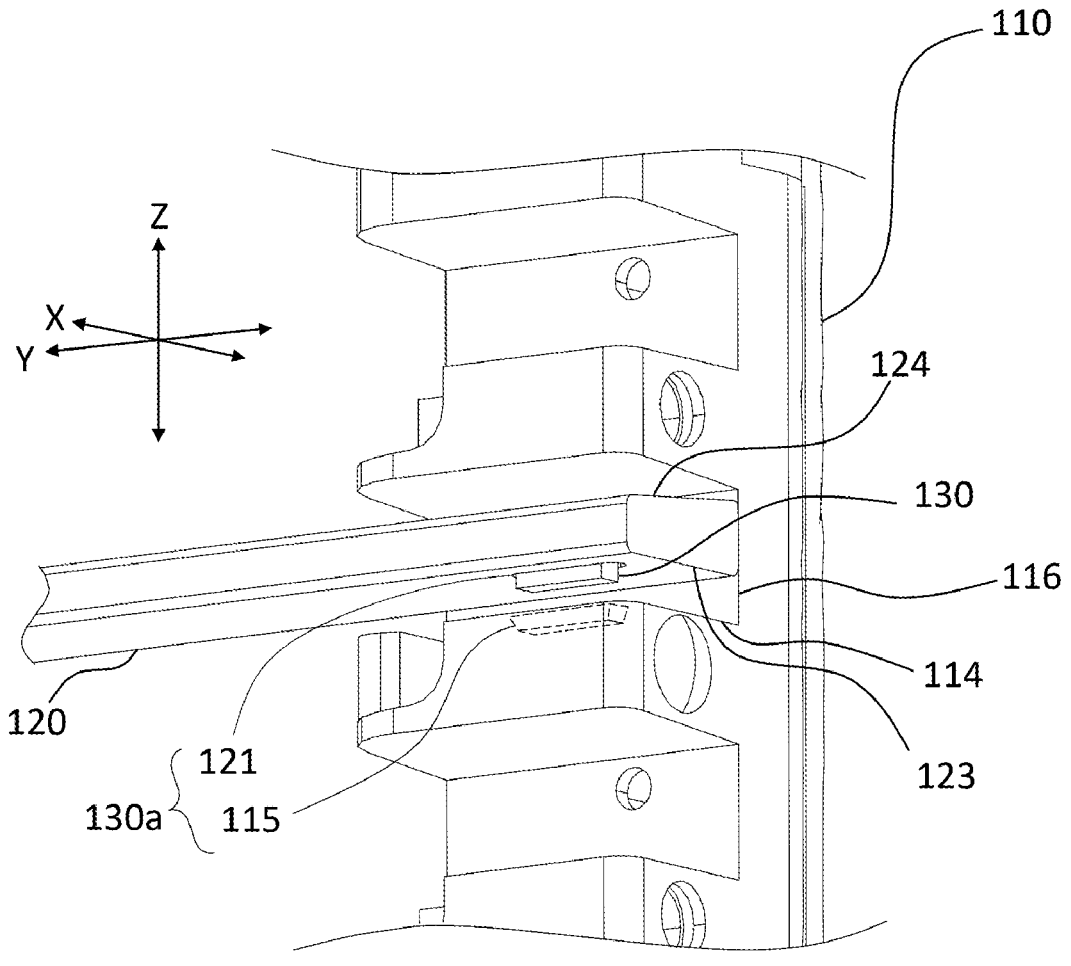
FIG. 7 is a schematic diagram of the supporter and the backbone.

Please refer to FIG. 3 and FIG. 4 to FIG. 7. FIG. 4 is a partial three-dimensional diagram of the supporting structure. FIG. 5a is an exploded diagram of a backbone, a stress block, and a first locking member. FIG. 5b is a partial cross-sectional diagram of the backbone, the stress block, and the supporters. FIG. 6a is an exploded diagram of the backbone, an adjusting block, and a second locking member. FIG. 6b is a partial cross-sectional diagram of the backbone, the adjusting block, and the supporters. FIG. 7 is a schematic diagram of the supporter and the backbone. The supporting structure 100 includes a backbone 110 and several parallel blocks 130. A number of supporters 120 are connected to the backbone 110, and the parallel blocks 130 are used for fixing the supporters 120. In the present embodiment, the supporting structure 100 further includes several stress blocks 140 and several adjusting blocks 150. The backbone 110 is disposed in the substrate carrier 200 and located in a center supporting location of the vertical inner space of the substrate carrier 200. The backbone 110 is configured to have the supporters 120 equal-distantly disposed thereon and to perform a subtle adjustment on the shifting amount of each supporter 120. Due to the fact that similar elements share the same features and structures, a combination of one supporter 120, one parallel block 130, one stress block 140, and one adjusting block 150 is detailed below to clearly show the features of the present embodiment of the invention.

The backbone 110 is vertically disposed in the substrate carrier 200 and has several supporting portions 113 that are equal-distantly arranged on the backbone 110. One receiving trench 116 is defined between two adjacent supporting portions 113 for receiving one supporter 120, as shown in FIG. 5a. Each supporting portion 113 is provided with a first limiting portion 115 and each supporter 120 is provided with a second limiting portion 121 (shown in FIG. 7) corresponding to the first limiting portion 115. The first limiting portion 115 is located on a top surface 114 of the supporting portion 113. For example, the first limiting portion 115 is formed by way of recessing from the top surface 114 or forming an indented channel connecting the two sides of the supporting portion 113. The second limiting portion 121 is formed on a lower surface 123 pf the supporter 120. The parallel block 130 is disposed between the first limiting portion 115 and the second limiting portion 121 to restrain a relative movement of the supporter 120 in the receiving trench 116 relative to the supporting portion 113.

As shown in FIG. 7, the parallel block 130 is fixed in the second limiting portion 121 of the supporter 120. When the supporter 120 is placed into the receiving trench 116, the parallel block 130 inserts into the first limiting portion 115 to fix the supporter 120. In one embodiment, the parallel block 130 is fixed in the second limiting portion 121 through adhesive or other applicable technical means. The parallel 130 block is partially situated in the second limiting portion 121, which means the parallel block 130 is partially protruded from the second limiting portion 121. When the supporter 120 and the parallel block 130 thereon is installed into the receiving trench 116, the lower surface 123 is in contact with the top surface 114 of the supporting portion 113, and the protruded part of the parallel block 130 outside the second limiting portion 121 inserts into the first limiting portion 115. The first limiting portion 115 and the second limiting portion 131 together define a parallel slot 130a. The parallel block 130 structurally conforms with the parallel slot 130a, so the parallel block 130 can be placed in the parallel slot 130a to fix the supporter 120 and prevent the supporter 120 from tilting or shifting.

The supporters 120 can be exemplified by carbon rods whose material is slightly flexible, and therefore a minor deformation can be produced to achieve the effect of calibration of the deviation amount. In the present embodiment, each supporter 120 is an elongated strip structure, and an upper surface of which is a beveled surface 124 for mating with the stress block 140. The supporter 120 contacts the supporting portion 113 via a lower surface 123, thereby disposing the supporter 120 on a top surface 114 of the supporting portion 113, as shown in FIG. 5a. A far side of the supporter 120 is suspended in the substrate carrier 200 for supporting the semiconductor substrates. Practically, two sides of each semiconductor substrate are supported by a pair of slits provided on the left and right inner walls of the substrate carrier 200. The supporter 120 supports the semi-conductor substrate in the middle, so sufficient support can be provided to the substrate and the problems like bending or deformation of the substrate can be eliminated.

As shown in FIG. 5a and FIG. 5b, the stress block 140 is disposed between the receiving trench 116 and the supporter 120 to fix the supporter 120 and is used for adjusting a first shifting amount m1 of the supporter 120 in the receiving trench 116. In the present embodiment, the stress block 140 includes a wedge body 141 and a protruded bump 142. The wedge body 141 has a clamping surface 144 for mating with the beveled surface 124 of the supporter 120. The beveled surface 124 is opposite to the lower surface 123 of the supporter 120. On the wedge body 141, the opposite side of the clamping surface 144 is an upper contact surface 148 for abutting against the bottom surface of the adjacent support-ing portion 113, so the stress block 140 is disposed in the receiving trench 116 and is clamped between the supporter 120 and the supporting portion 113. In other words, one end of the supporter 120 and the stress block 140 are simulta-neously received in the receiving trench 116 between two adjacent supporting portions 113. The protruded bump 142 is located at an edge 145 of the clamping surface 144. The stress block 140 fixes the supporter 120 through the clamp-ing surface 144 and the protruded bump 142. In one embodi-ment, a guide angle 147 is provided at a location where the clamping surface 144 connects to the protruded bump 142, and the guide angle 147 matches to a contour of a corner 127 of the supporter 120. In one embodiment, the curve of the guide angle 147 matches with the curve of the corner 127 of the supporter 120, thereby having the stress block 140 in close contact with the supporter 120. As a result, a good clamping force is provided. In one embodiment, the clamp-ing force of the stress block 140 to the supporter 120 can measure as high as 3.5 kgs, thus providing a good fixture effect. In this manner, the supporter 120 is fixed by the stress block 140 from multiple directions, for example, restraining the movement of the supporter 120 in X axis, Y axis, and Z axis. Further, by using the protruded bump 142, the move-ment in the X axis and Y axis (i.e., in the horizontal directions) can be further prevented.

In one embodiment, the supporting structure 100 further includes a first locking member 161 passing through the backbone 110 and locking with the stress block 140. The first shifting amount m1 of the supporter 120 in a first horizontal direction D1 of the backbone 110 is determined by how much the first locking member 161 locks with the stress block 140. The first horizontal direction D1 is parallel to a short axial direction S1 of the supporter. When the first locking member 161 is screwed in the tightening direction (e.g., in the clockwise direction), the first locking member 161 pulls stress block 140 toward the backbone 110. The shifting amount of the supporter 120 in the horizon direction is adjusted toward the right-hand side of FIG. 5b. On the contrary, when the first locking member 161 is screwed in the loosening direction (e.g., in the counterclockwise direc-tion), the first locking member 161 pushes the stress block

140 away from the backbone 110. The shifting amount of the supporter 120 in the horizon direction is adjusted toward the left-hand side of FIG. 5b.

As shown in FIG. 6a and FIG. 6b, the adjusting block 150 is disposed on a lateral side 117 of the supporting portion 113 for abutting against the supporter 120 and for adjusting a second shifting amount m2 of the supporter 120. In the present embodiment, the adjusting block 150 includes a trapezoid body 151 which has an upper inclined surface 154 for pressing against the supporter 120; to be exact, pressing against the lower surface 123 of the supporter 120. When the adjusting block 150 moves in a second horizontal direction D2, the supporter 120 can be lifted by the upper inclined surface 154, and the function of adjusting the second shifting amount m2 is therefore achieved.

The supporting structure 100 further includes a second locking member 162 passing through the backbone 110 and locking with the adjusting block 150. The second shifting amount m2 of the supporter 120 in a second horizontal direction D2 of the backbone 110 is determined by how much the second locking member 162 locks with the adjust-ing block 150. The second horizontal direction D2 is per-pendicular to the first horizontal direction D1 and is parallel to a long axial direction S2 of the supporter 120. When the second locking member 162 is screwed in the tightening direction (e.g., clockwise direction), the second locking member 162 pulls the adjusting block 150 toward the supporting portion 113 of the backbone 110. The vertical tilt amount of the supporter 120 is adjusted toward the top side of FIG. 6b. On the contrary, when the second locking member 162 is screwed in the counterclockwise direction, the vertical tilt amount of the supporter 120 is adjusted toward the bottom side of FIG. 6b.

Figure 8:
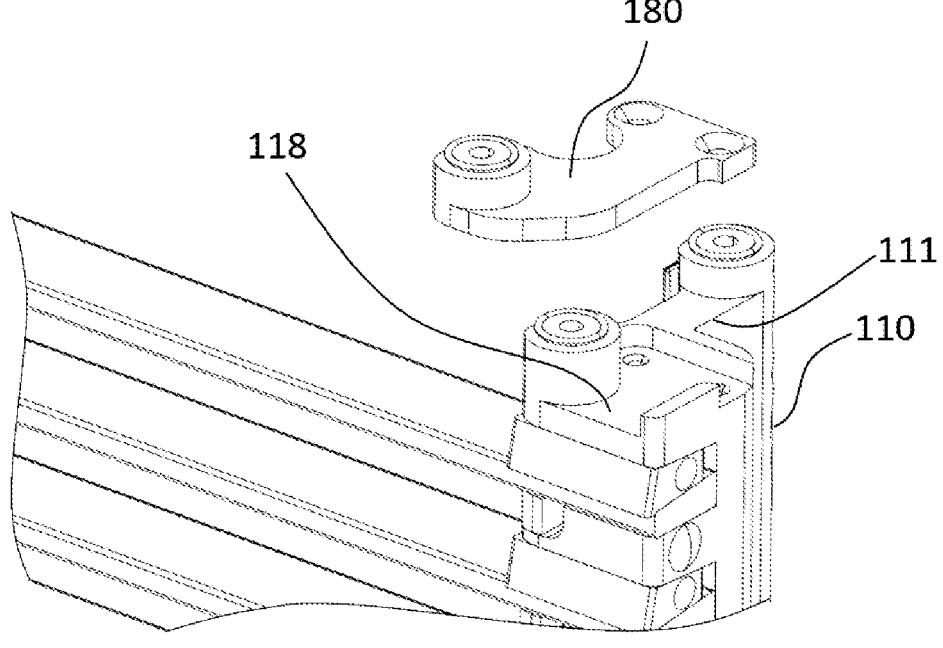
FIG. 8 is a schematic diagram of a top end of the backbone and an upper fixing block before assembling.
Figure 9:
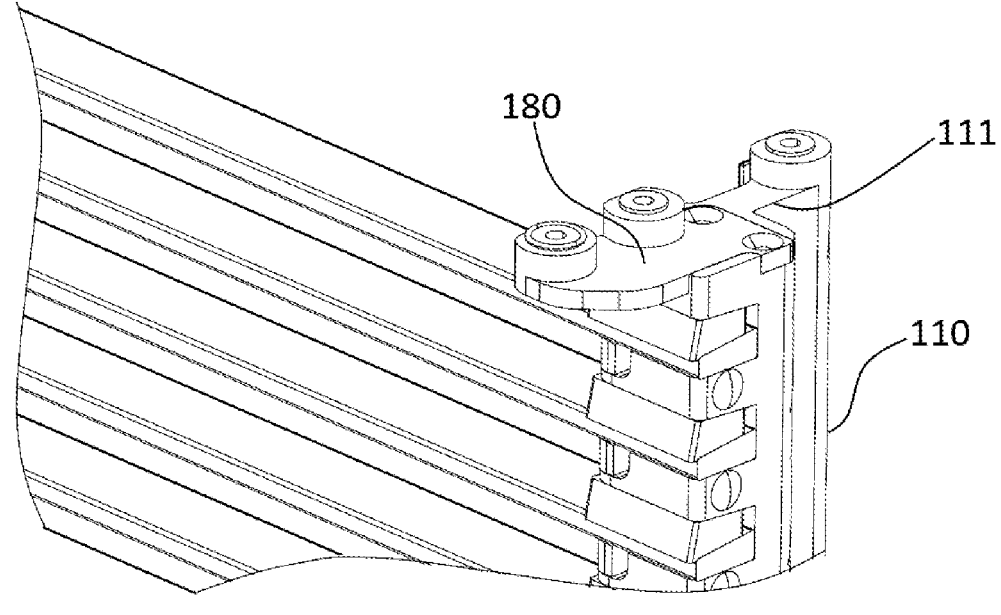
FIG. 9 is a schematic diagram of the top end of the backbone and the upper fixing block after assembled.
Figure 10:
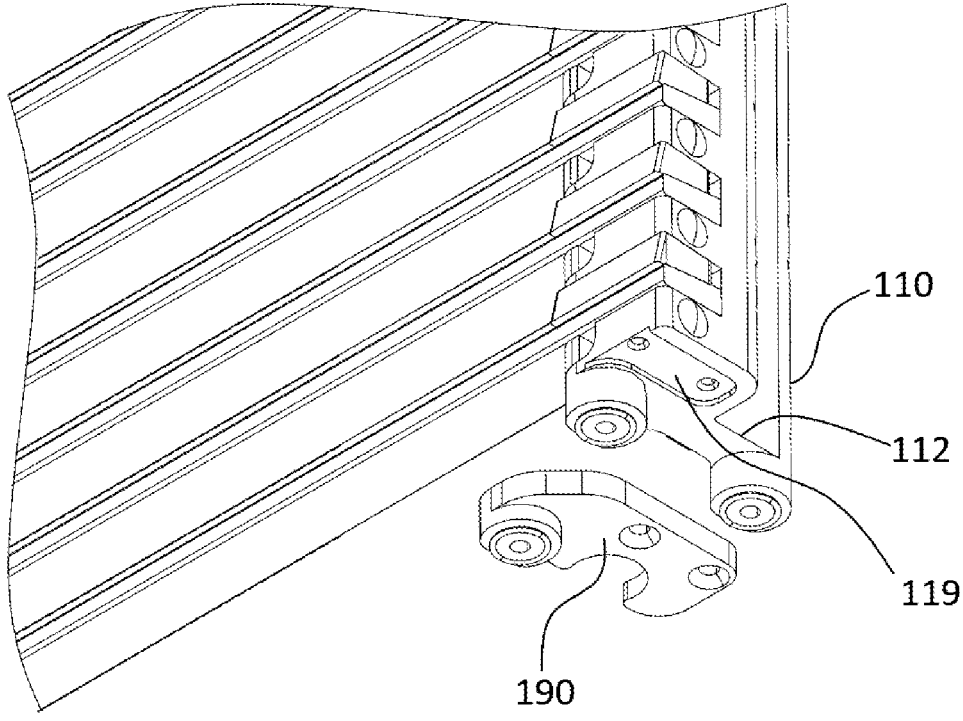
FIG. 10 is a schematic diagram of a bottom end of the backbone and a lower fixing block before assembling.
Figure 11:
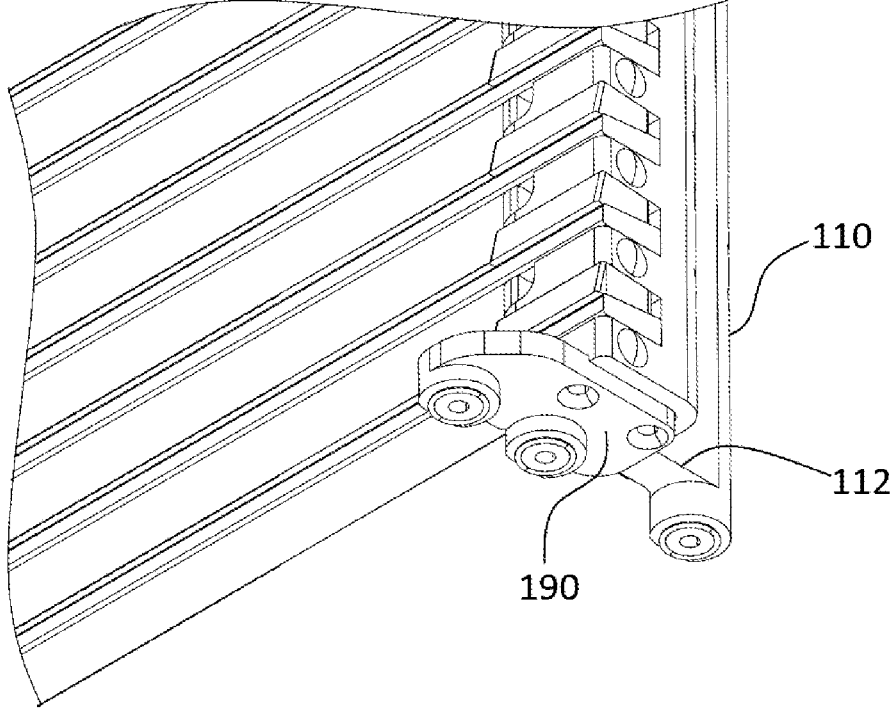
FIG. 11 is a schematic diagram of the bottom end of the backbone and the lower fixing block after assembled.

Please refer to FIG. 1 and FIG. 8 to FIG. 11. FIG. 8 is a schematic diagram of a top end of the backbone and an upper fixing block before assembling. FIG. 9 is a schematic diagram of the top end of the backbone and the upper fixing block after assembled. FIG. 10 is a schematic diagram of a bottom end of the backbone and a lower fixing block before assembling. FIG. 11 is a schematic diagram of the bottom end of the backbone and the lower fixing block after assembled. The backbone 110 has a top end 111 having an upper groove 118 and an opposite bottom end 112 having a lower groove 119. The supporting structure 100 further includes an upper fixing block 180 and a lower fixing block 190. The upper fixing block 180 is at the top end 111 for coupling with the upper groove 118, and the backbone 110 is connected to a top portion 210 of the substrate carrier 200 through the top end 111 and upper fixing block 180. The lower fixing block 190 is at the bottom end 112 for coupling with the lower groove 119, and the backbone 110 is con-nected to a bottom portion 220 of the substrate carrier 200 through the bottom end 112 and the lower fixing block 190. The shape of the upper groove 118 corresponds to the contour of the upper fixing block 180, so when the upper fixing block 180 is coupled with the upper groove 118, its position can be fixed and the problems like shifting or rotating can be prevented. Similarly, the same mechanism applies to the lower groove 119 and the lower fixing block 190, so when the two are coupled, problems like shifting or rotating can be prevented. As shown in FIG. 9 and FIG. 11, the screwing location can be increased through the upper fixing block 180 and the lower fixing block 190. In the present embodiment, three screwing locations are provided at the top end 111 and at the bottom end 112 respectively. The locking strength of the supporting structure 100 locking with the substrate carrier 100 can be enhanced, and the unexpected moving of the supporting structure 100 can be prevented.

Figure 12:
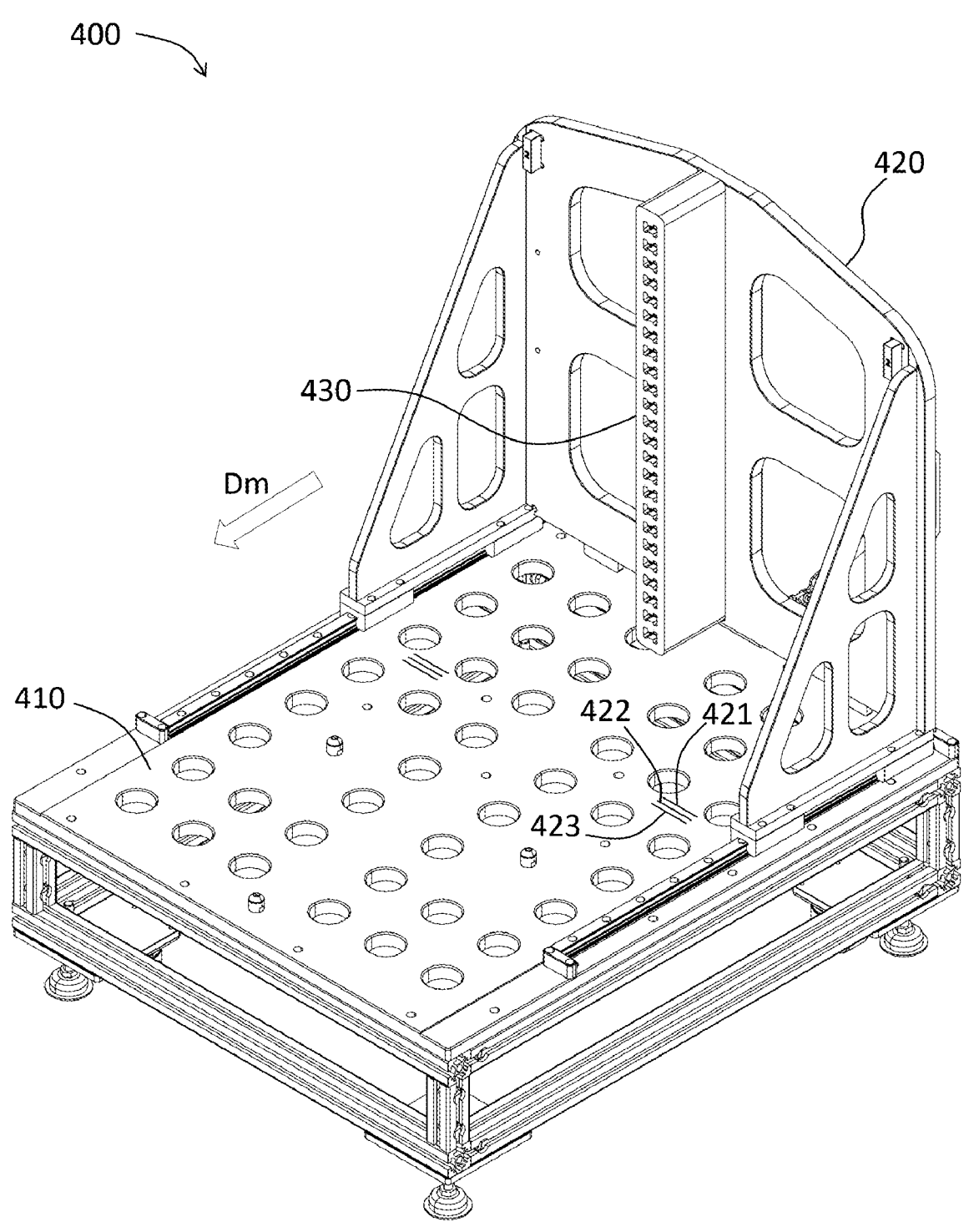
FIG. 12 is a three-dimensional diagram of one inspection equipment according to one embodiment of the invention.
Figure 13:
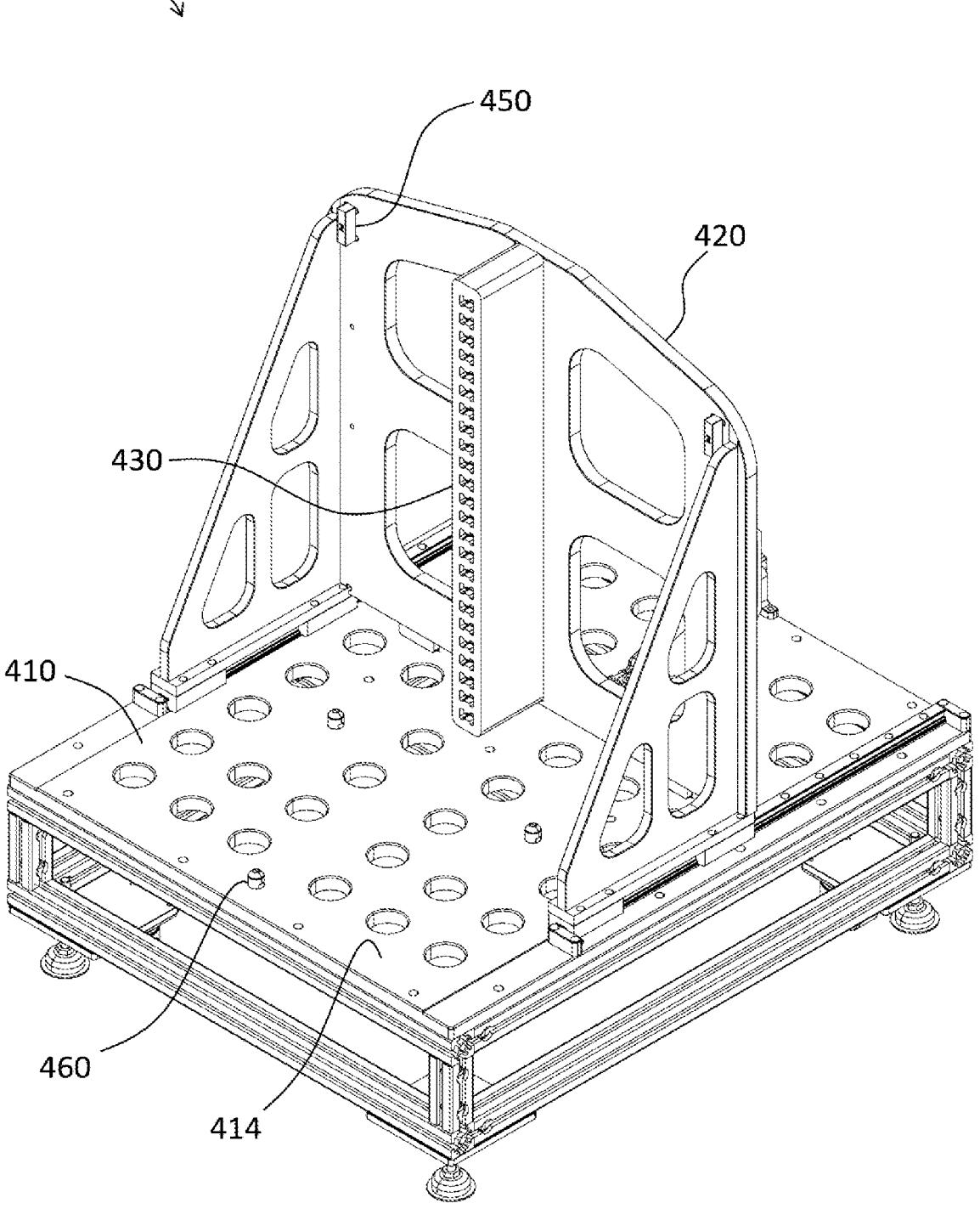
FIG. 13 is a three-dimensional diagram of the inspection equipment in another state.
Figure 14:
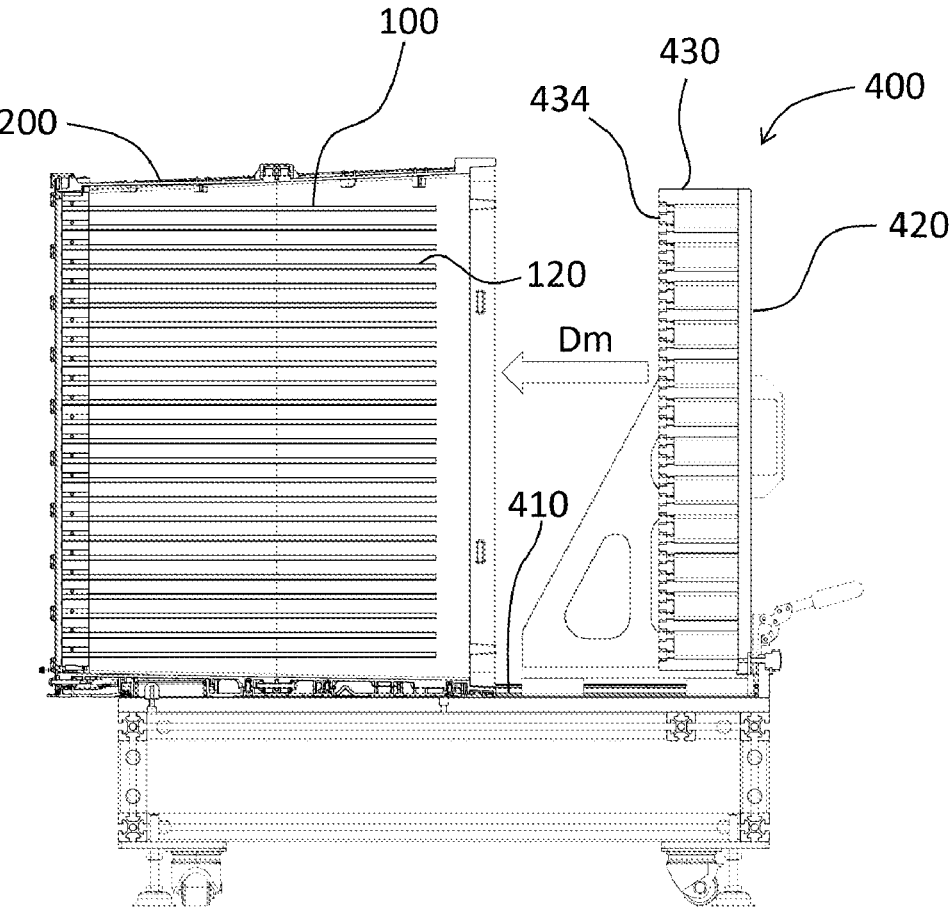
FIG. 14 is a cross-sectional diagram of the substrate carrier and the inspection equipment.

The detailed description now turns to the inspection equipment. Please refer to FIG. 12 to FIG. 14. FIG. 12 is a three-dimensional diagram of one inspection equipment according to one embodiment of the invention. FIG. 13 is a three-dimensional diagram of the inspection equipment in another state. FIG. 14 is a cross-sectional diagram of the substrate carrier and the inspection equipment.

The inspection equipment 400 is used for inspecting the supporting structure 100. Here the supporting structure 100 in previously described embodiments is used as an example, and the present embodiment continues to use the same element names and numbers. The inspection equipment 400 includes a platform 410, a moving door 420, and an inspection member 430. The platform 410 is used for supporting the substrate carrier 200. The moving door 420 is movably disposed on the platform 410 for moving toward or away from the substrate carrier 200. The inspection member 430 is disposed on the moving door 420 and includes an inspection surface 434 and plural inspection regions (here in the present embodiment the regions are exemplified by a first inspection region 431, a second inspection region 432, and a third inspection region 433). The inspection surface 434 is used for abutting against the supporter 120. A deviation amount of the supporter 120 can be inspected by the inspection regions 431, 432, and 433 based on how much the moving door 420 travels toward the substrate carrier 200.

The inspection member 430 moves toward or away from the substrate carrier 200 with the moving door 420. One example of moving the moving door 420 in the moving direction Dm can be shown from the location of FIG. 12 to the location of FIG. 13. The moving door 420 is moved toward the substrate carrier 200 in this example. To be more specific, the inspection member 430 on the moving door 420 is moved toward the supporting structure 100 in the substrate carrier 200 to perform the inspection on the deviation amount of the supporter 120. The platform 410 is sequentially provided with a first inspection location 421, a second inspection location 422, and a third inspection location 423 along the moving direction Dm. The locations 421, 422, and 423 are used to indicate a stop location of the door 420, which shows different inspection results. The first inspection location 421 corresponds to the first inspection region 431, the second inspection location 422 corresponds to the second inspection region 432, and the third inspection location 423 corresponds to the third inspection region 433. When the moving door 420 is moved to one of the three inspection locations 421, 422, or 423, the location of the supporter 120 falling within which one of the three inspection regions 431, 432, or 433 can be acquired. Practically, the deviation amount of the supporter 120 that can be inspected includes a multi-axial deviation amount of the supporter 120 received in the receiving trench 116 of the backbone 110. The multi-axial deviation amount includes left shifting amount, right shifting amount, upward tilting amount, and downward tilting amount.

Figure 15:
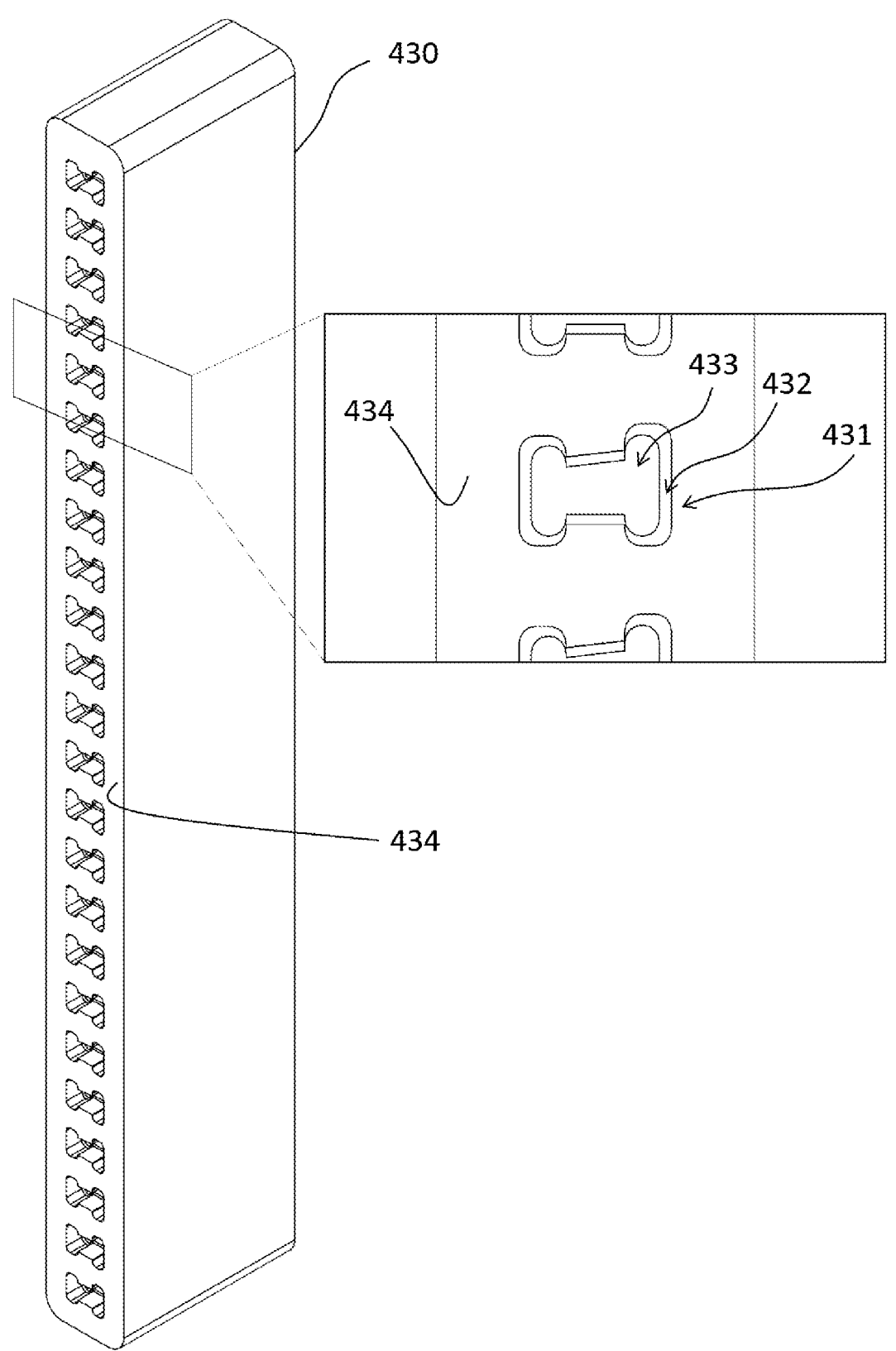
FIG. 15 is a schematic diagram of the inspection member.

Please refer to FIG. 14 and FIG. 15. FIG. 15 is a schematic diagram of the inspection member. In the present embodiment, the inspection regions include the first inspection region 431 and the second inspection region 432 located inside the first inspection region 431. In addition, the third inspection region 433 is also included and is located inside the second inspection region 432. The second inspection region 432 is formed by way of recessed from the inspection surface 434 so the second inspection region 432 is lower than the first inspection region 431. As a result, when the supporter 120 falls in the first inspection region 431 and in the second inspection region 432 respectively, the moving door 420 has different moving extents (i.e., moving distances). The different inspection results will be elaborated below.

Figure 16:
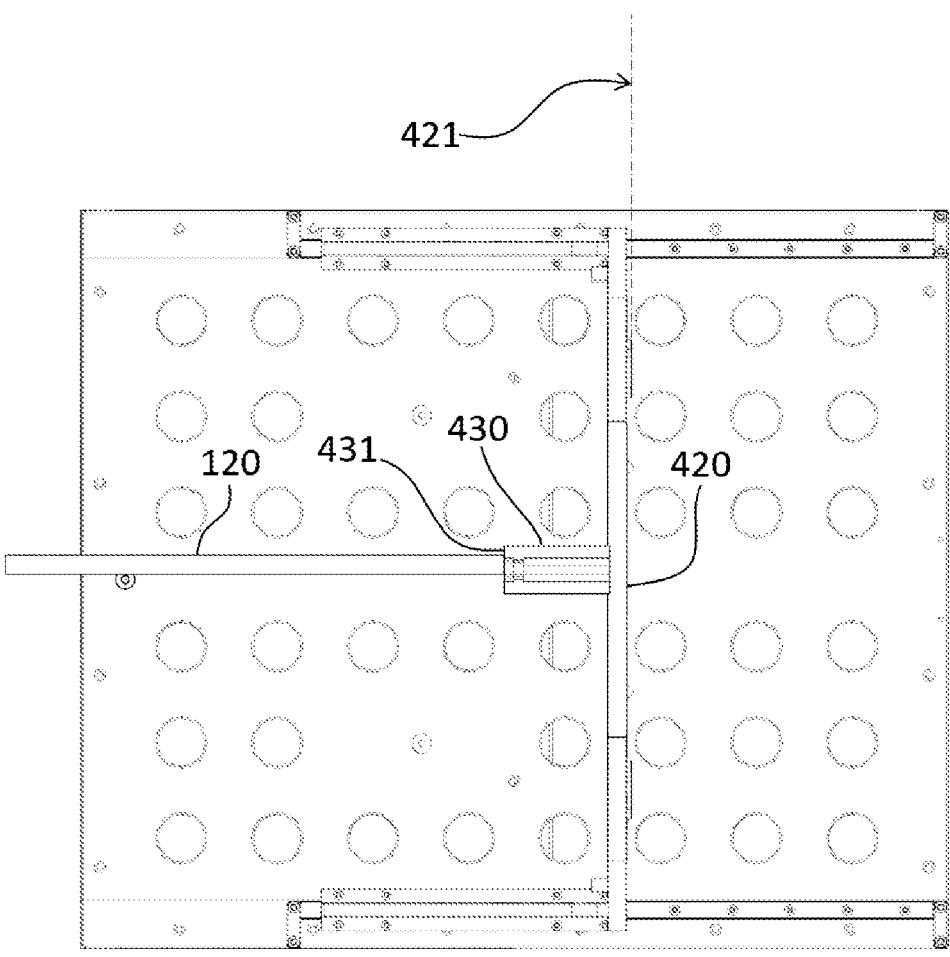
FIG. 16 is a schematic diagram of the moving door at the first inspection location.
Figure 17:
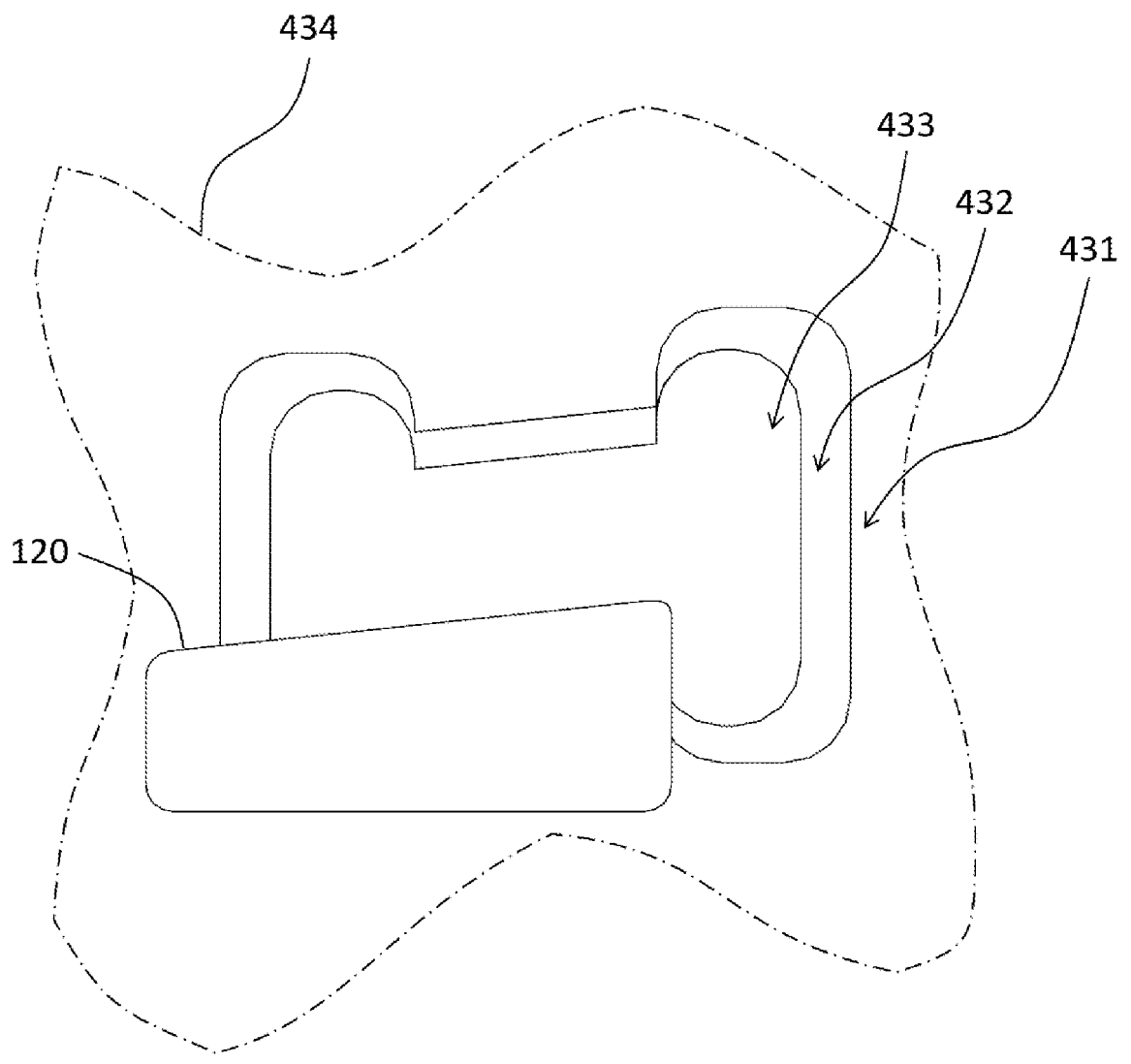
FIG. 17 is a schematic diagram of the supporter being in contact with the first inspection region.

The first inspection result of the present embodiment is now detailed. Please refer to FIG. 16 and FIG. 17. FIG. 16 is a schematic diagram of the moving door at the first inspection location. FIG. 17 is a schematic diagram of the supporter being in contact with the first inspection region. In a case that the supporter 120 contacts the first inspection region 431 as the moving door 420 moves towards the substrate carrier 200, the moving door 420 stops at the first inspection location 421. When the moving door stops at the first inspection location 421 on the platform 410, it indicates that the supporter 120 has a first deviation amount larger than an inspection range. In one embodiment, the inspection range is defined by left/right shifting in +2 mm and up/down tilting in +1.5 mm. When any one of supporters 120 deviates more than 2 mm to the left or to the right, the supporter 120 will contact the first inspection region 431 of the inspection surface 434. At the moment, the moving door 420 stops at the first inspection location 421 and cannot be pushed further in. Similarly, when any one of the supporters 120 deviates more than 1.5 mm upwardly or downwardly, the supporter 120 will contact the first inspection region 431 and the moving door 420 cannot be pushed further in. This inspection result shows that the deviation amount of the supporter 120 is larger than the inspection range, and the deviation amount needs to be adjusted; for example, by using the stress block 140 and the adjusting block 150 to adjust the deviation amount of the supporter 120.

Figure 18:
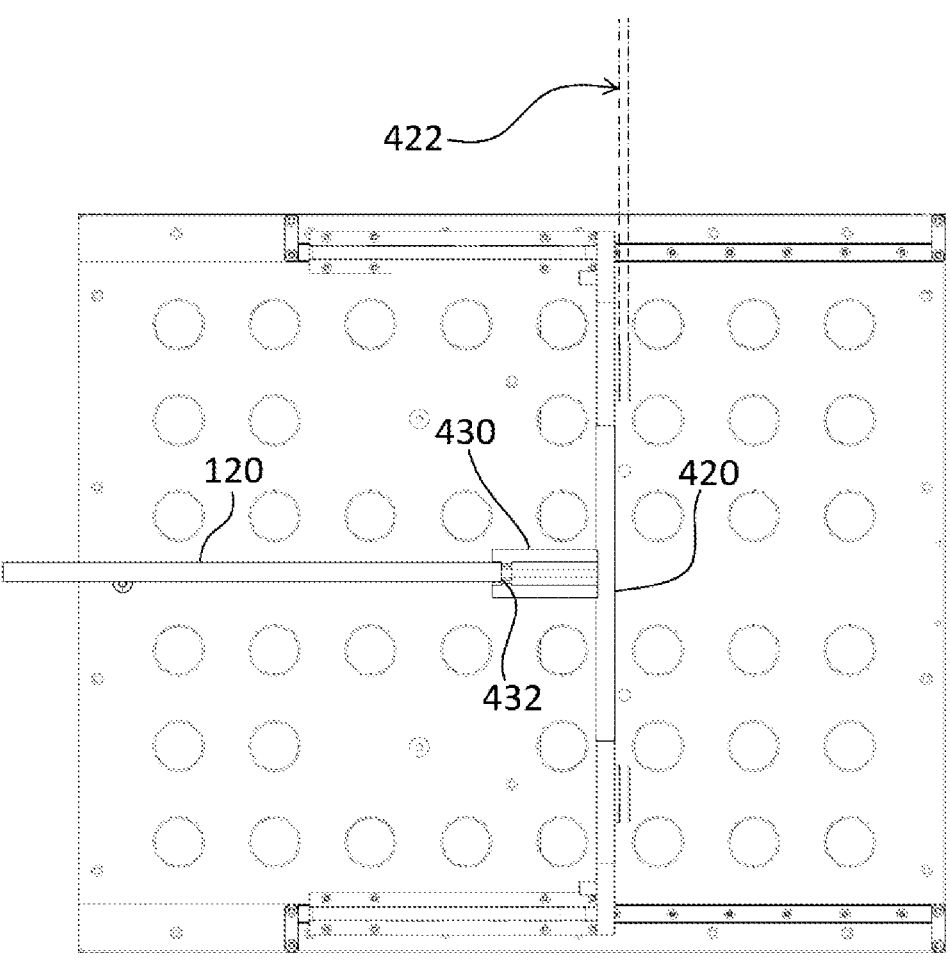
FIG. 18 is a schematic diagram of the moving door at the second inspection location.
Figure 19:
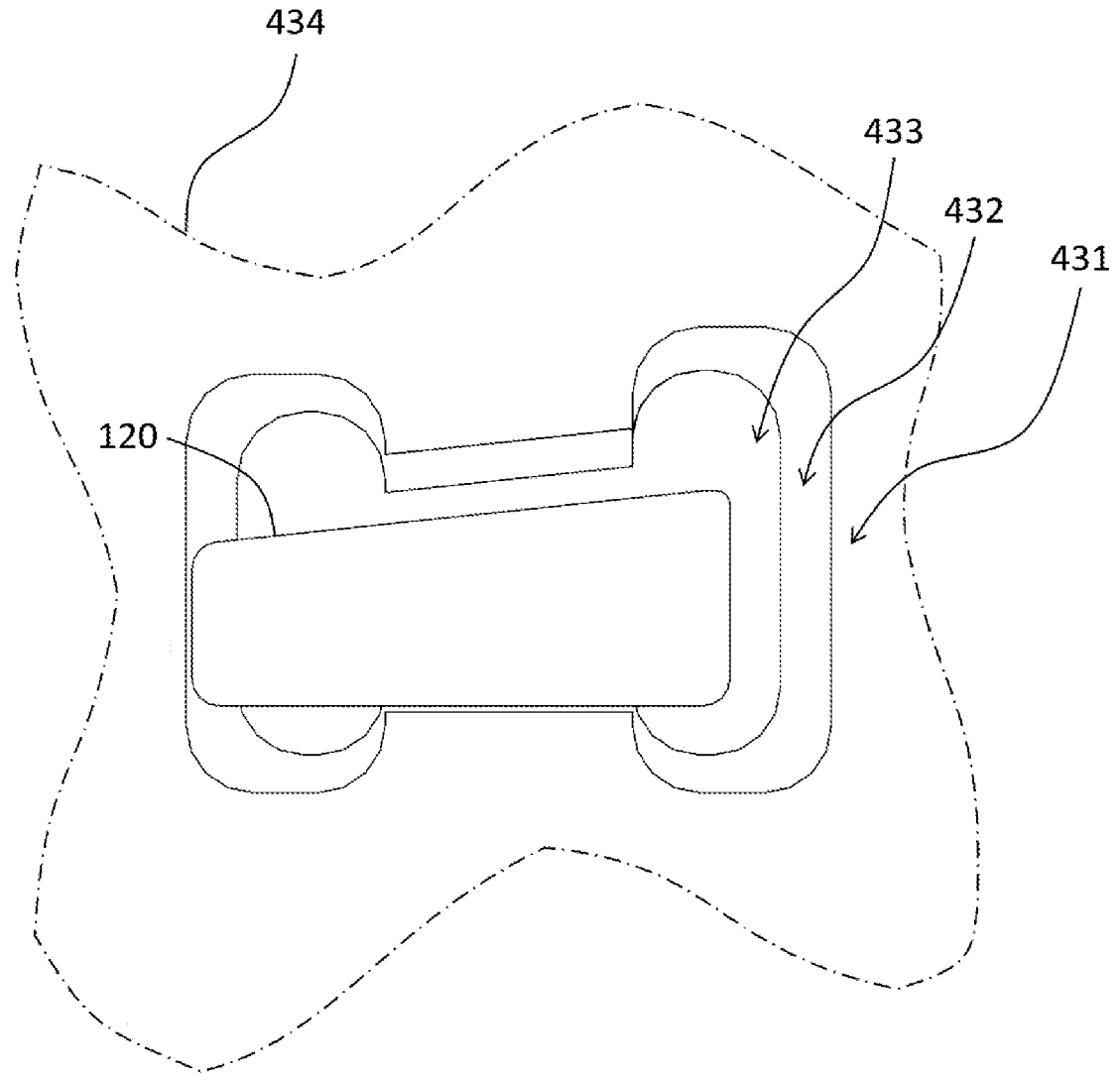
FIG. 19 is a schematic diagram of the supporter being in contact with the second inspection region.

The second inspection result of the present embodiment is now elaborated in detail. Please refer to FIG. 18 and FIG. 19. FIG. 18 is a schematic diagram of the moving door at the second inspection location. FIG. 19 is a schematic diagram of the supporter being in contact with the second inspection region. In a case that the supporter 120 contacts the second inspection region 432 as the moving door 420 moves towards the substrate carrier 200, the moving door 420 stops at the second inspection location 422. When the moving door stops at the second inspection location 422, it indicates that the supporter 120 has a second deviation amount smaller than or equal to the inspection range. When any one of supporters 120 deviates less than 2 mm to the left or to the right, the supporter 120 will contact the second inspection region 432. At the moment, the moving door 420 stops at the second inspection location 422 and cannot be pushed further in. Similarly, when any one of the supporters 120 deviates less than 1.5 mm upwardly or downwardly, the supporter 120 will contact the second inspection region 432. This inspection result shows that the deviation amount of the supporter 120 is within the inspection range, and adjustment is not necessary. The supporters 120 are good to support semiconductor substrates.

Figure 20:
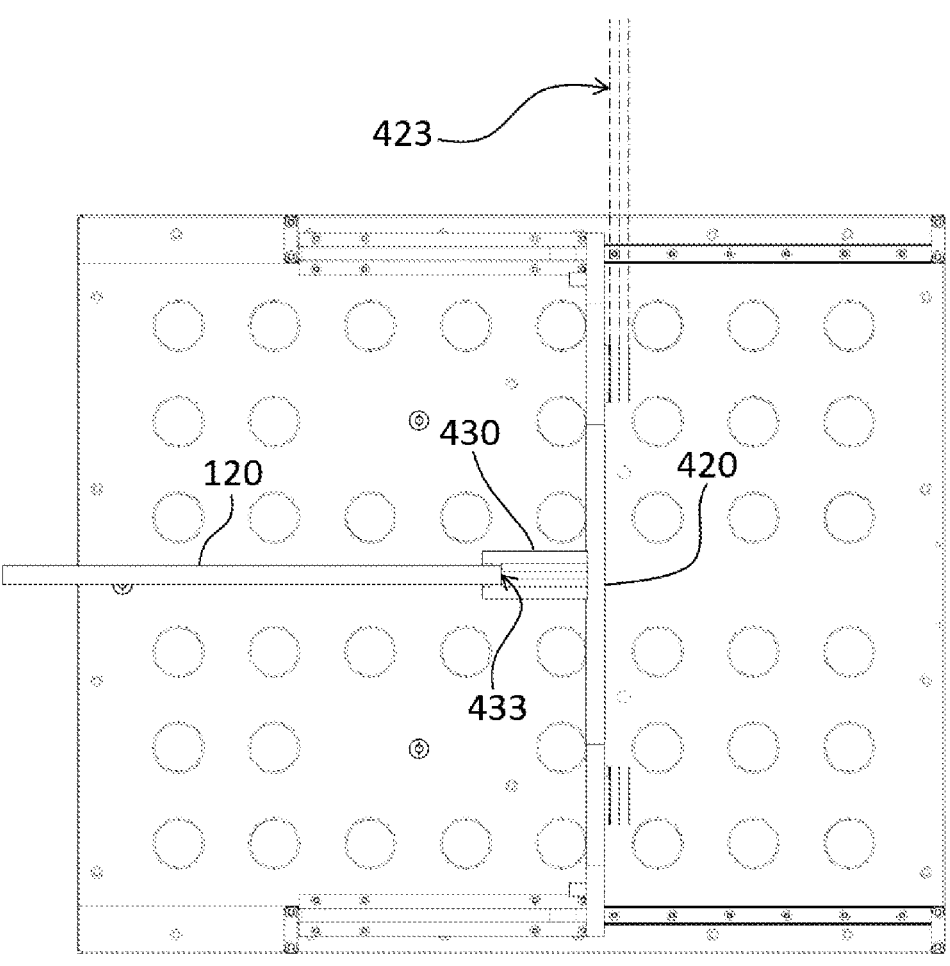
FIG. 20 is a schematic diagram of the moving door at the third inspection location.
Figure 21:
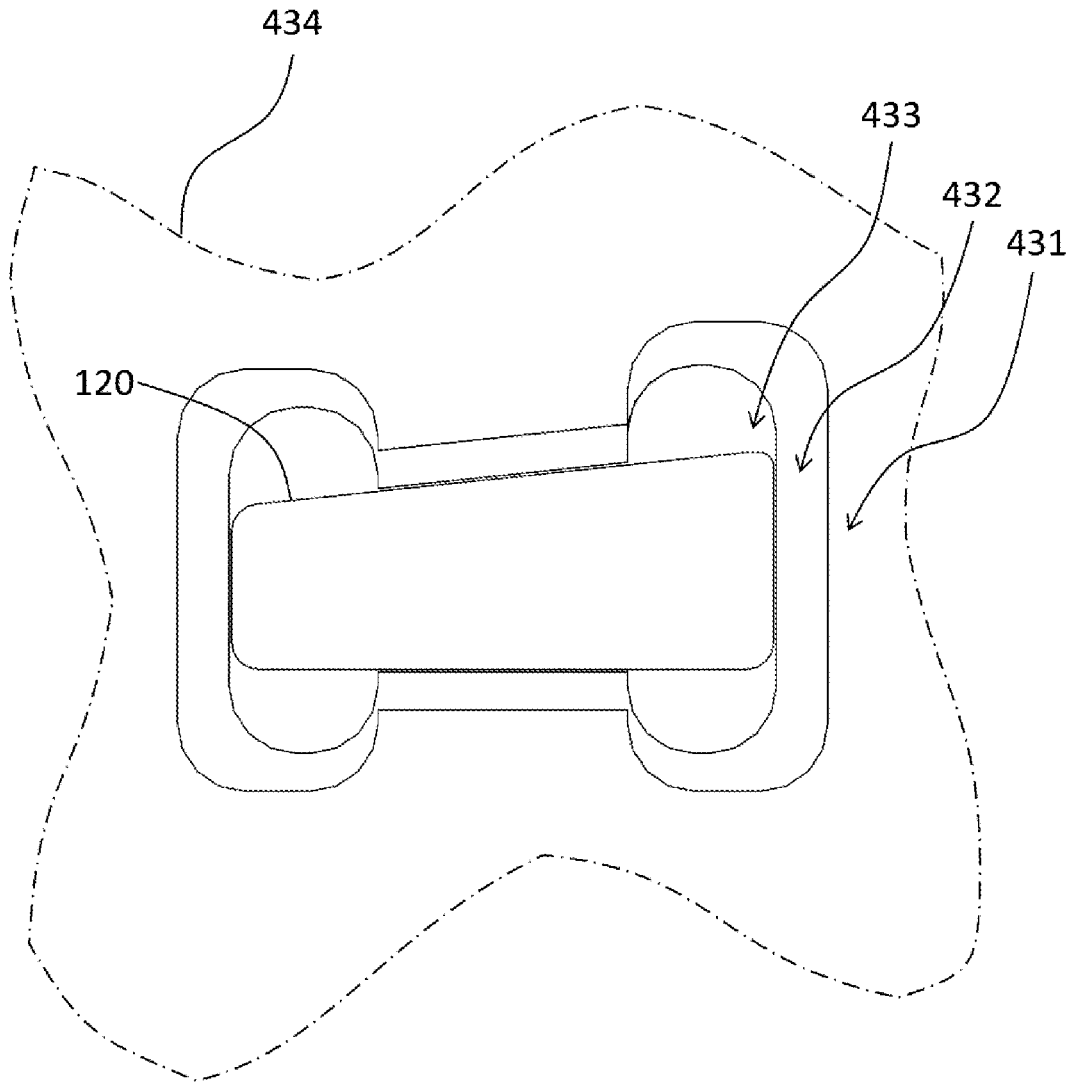
FIG. 21 is a schematic diagram of the supporter being in contact with the third inspection region.

Now the elaboration directs to the third inspection result of the present embodiment. Please refer to FIG. 20 and FIG. 21. FIG. 20 is a schematic diagram of the moving door at the third inspection location. FIG. 21 is a schematic diagram of the supporter being in contact with the third inspection region. In a case that the supporter 120 falls in the third inspection region 433 as the moving door 420 moves towards the substrate carrier 200, the moving door 420 can be pushed to the third inspection location 423. When the moving door stops at the third inspection location 433, it indicates that the supporter 120 has a third deviation amount conforms with a calibration condition, and the third deviation amount is smaller than the second deviation amount. When any one of the supporters 120 deviates less than 0.1 mm to the left or to the right, the supporter 120 will fall in the third inspection region 433. When any one of the supporters 120 deviates less than 0.1 mm upwardly or downwardly, the supporter 120 will fall in the third inspection region 433. This inspection result shows that the supporter 120 has an even smaller deviation amount, and adjustment is not necessary. The supporters 120 are good to support semiconductor substrates. In fact, the third inspection result shows that the supporter 120 has a very small deviation amount, which conforms with the calibration condition while calibrating with a calibrating tool. The content of the calibrating tool will be detailed later.

Figure 22:
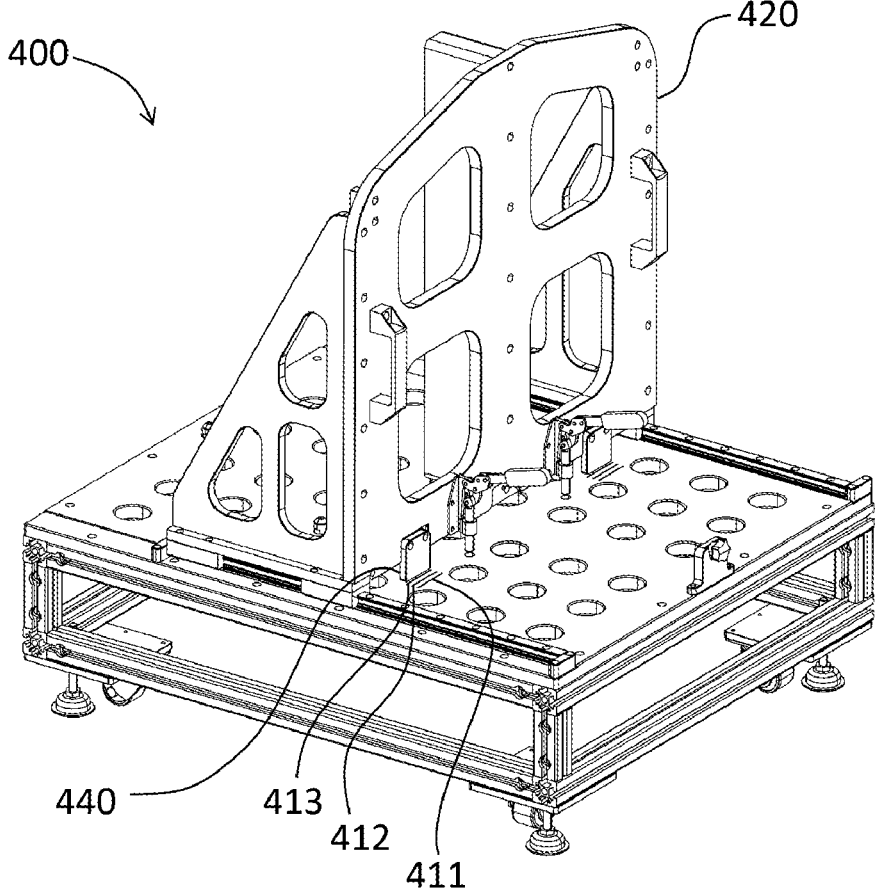
FIG. 22 is a three-dimensional diagram of the inspection equipment from another view angle.

Please refer to FIG. 22, which is a three-dimensional diagram of the inspection equipment from another view angle. The mechanism of showing the inspection locations can be implemented by a first inspection line 411, a second inspection line 412, and a third inspection line 413 that are arranged in parallel on the platform 410. In the present embodiment, the inspection equipment 400 further includes a travel depth indication block 440 disposed on the moving door 420. The travel depth indication block 440 is used to show the inspection result of the inspection member 430. The travel depth indication block 440 provides the function of indicating different deviation amounts of the supporter 120 based on the travel extents (i.e., travel distances) of the moving door 420 moving towards the substrate carrier 200. When the moving door 420 stops at the first inspection location 421, the second inspection location 422, or the third inspection location 423, the travel depth indication block 440 points at the first inspection line 411, the second inspection line 412, or the third inspection line 413, which clearly shows the inspection result.

On the other hand, the inspection equipment 400 of the present embodiment further includes a gap detector 450 and plural positioning pins 460, as shown in FIG. 13. The gap detector 450 is disposed on the moving door 420 for detecting an oblique state of the substrate carrier 200. The gap detector 450 can be exemplified by disposing on two sides of the moving door 420. If the substrate carrier 200 touches the gap detector 450 after being placed on the platform 410, it shows that the substrate carrier 200 is not positioned correctly and is in the oblique state. Its position needs to be adjusted. The positioning pins 460 are disposed on a surface 414 of the platform 410 and correspond to plural positioning recesses 221 (shown in FIG. 1). The positioning recesses 221 are disposed on the external surface of the bottom portion 220 of the substrate carrier 200. The positioning pins 460 are used for docking with the positioning recesses 221 so as to position the substrate carrier 200 on the platform 410.

Figure 23:
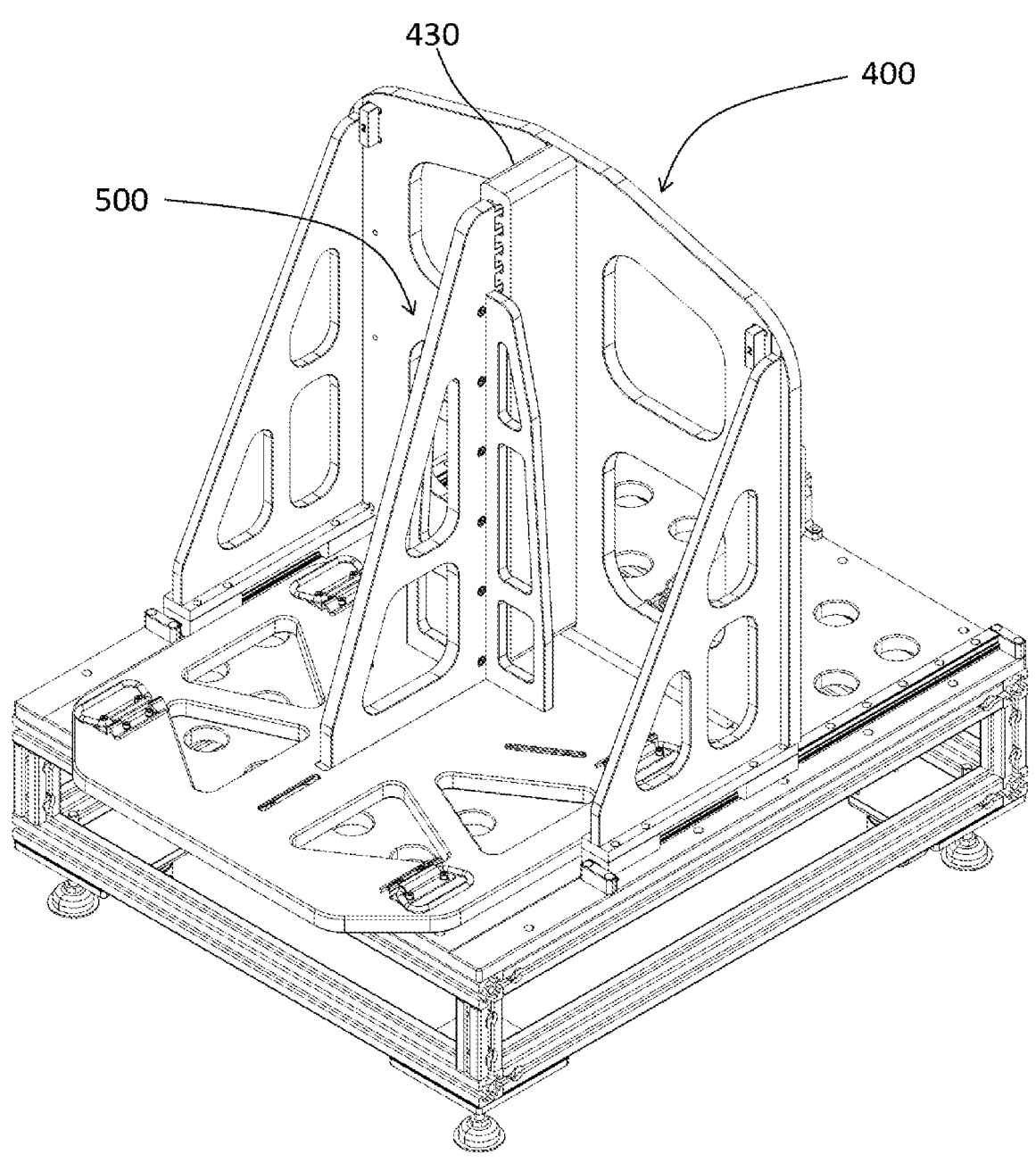
FIG. 23 is a three-dimensional diagram of the calibrating tool disposing on the inspection equipment according to one embodiment of the invention.
Figure 24:
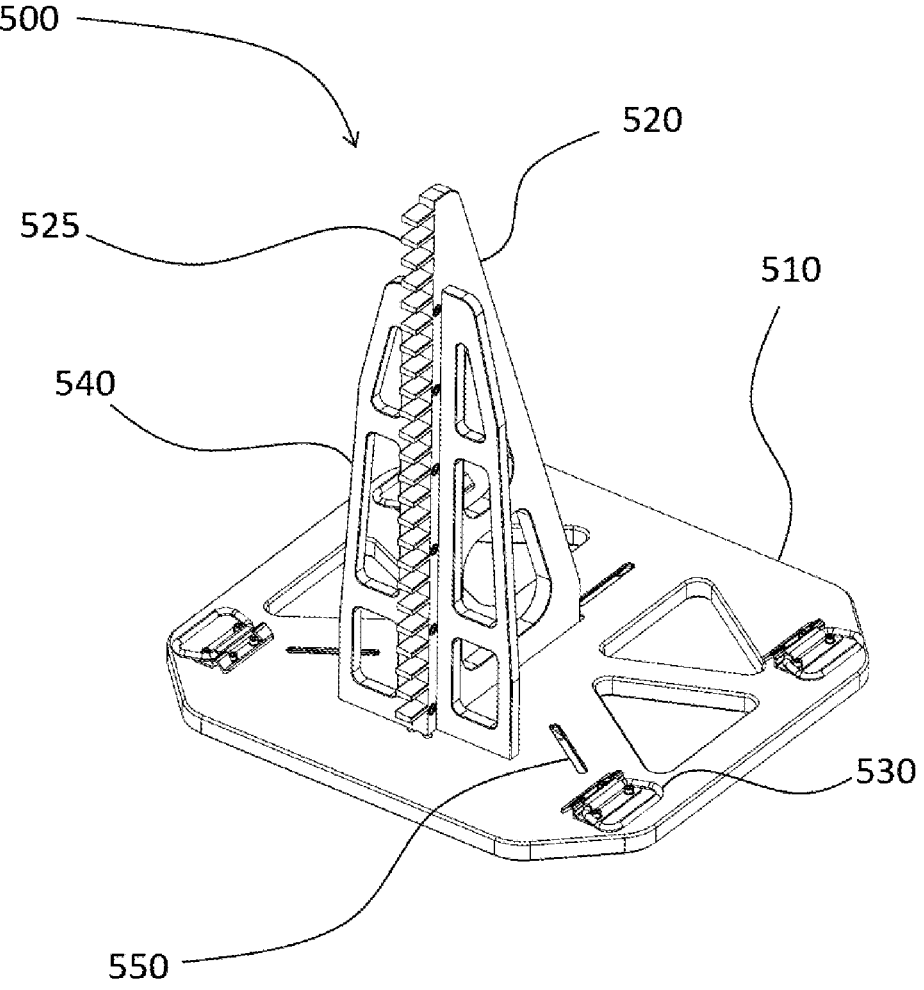
FIG. 24 is a three-dimensional diagram of the calibrating tool.

Now the elaboration turns to the calibrating tool. Please refer to FIG. 23 and FIG. 24. FIG. 23 is a three-dimensional diagram of the calibrating tool disposing on the inspection equipment according to one embodiment of the invention. FIG. 24 is a three-dimensional diagram of the calibrating tool.

The calibrating tool 500 is used for calibrating the inspection equipment 400. Here the inspection equipment 400 in previously described embodiments is used as an example, and the present embodiment continues to use the same element names and numbers. The calibrating tool 500 includes a base 510 and a vertical stand 520. The base 510 is used for sitting on the platform 410 of the inspection equipment 400. The vertical stand 520 is disposed uprightly on the base 510. The vertical stand 520 has plural calibration members 525 that are equal-distantly arranged on the vertical stand 520 for abutting against the inspection surface 434 of the inspection member 430. The calibration members 525 have a structure which is the same as the supporters 120, such as having the same beveled surface and lower surface. Each of the supporters 120 is received in the receiving trench 116, thereby having the supporters 120 equal-distantly arrange on the backbone 110. The calibration members 252 are separated at an interval which is the same as the interval of the supporters 120. In the present embodiment, the calibrating tool 500 is a unitary standardized aluminum piece, which replicates a standard height of the assembled supporters 120, where each level has a gap of 27 mm+0.05 mm. By using the calibrating tool 500, whether the inspection surface 434 conforms with the calibration condition or not is inspected through the inspection regions 431, 432, and 433 of the inspection member 430 based on how much the moving door 420 travels toward the calibrating tool 500.

In the present embodiment, the first inspection region 431 defines a first deviation amount which is larger than a calibration range. The second inspection region 432 inside the first inspection region 431 defines a second deviation amount which is larger than the calibration range. The third inspection region 433 inside the second inspection region 432 defines a third deviation amount smaller than or equal to the calibration range. The third deviation amount is smaller than the second deviation amount, and the second deviation amount is smaller than the first deviation amount.

In a case that the deviation amount of the inspection surface 434 is in the calibration range, the moving door 420 stops at the third inspection location 423 as it moves toward the calibrating tool 500, which indicates that the inspection surface 434 conforms with the calibration condition, and the deviation amount of the inspection surface 434 is smaller than or equal to the calibration range. The inspection member 430 is accurate, no further adjustment is required, and it is good to be used to inspect supporting structure 100 of the substrate carrier 200. On the contrary, in a case that the deviation amount of the inspection surface 434 is beyond the calibration range and the moving door 420 stops at the second inspection location 422, it shows that the inspection surface 434 does not meet the calibration condition. The size of the inspection member 430 is incorrect or the installation thereof is not proper. The inspection member 430 is in a to-be-calibrated state and needs to be adjusted or replaced. Similarly, in a case that the deviation amount of the inspection surface 434 is beyond the calibration range and the moving door 420 stops at the first inspection location 421, it shows that the inspection surface 434 does not meet the calibration condition. The inspection member 430 is in the to-be-calibrated state and needs to be adjusted or replaced.

Figure 25:
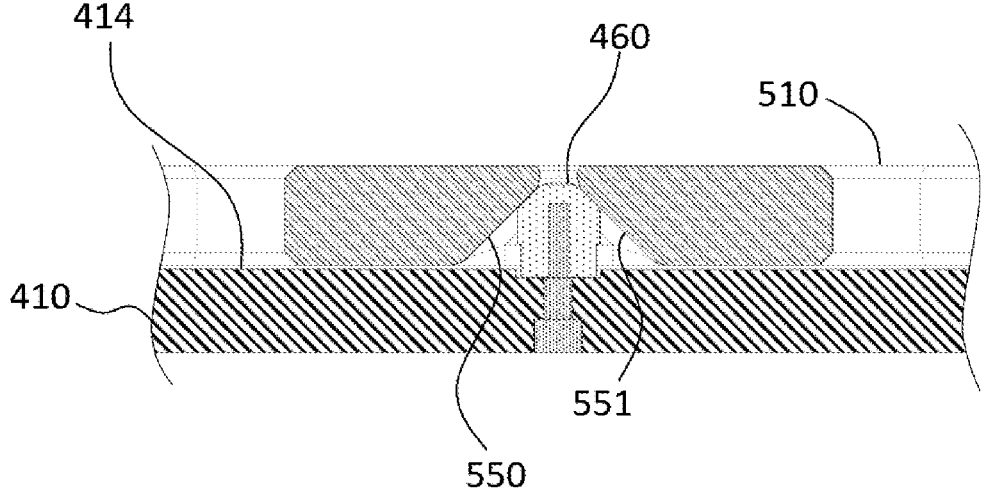
FIG. 25 is a partial cross-sectional diagram of the calibrating tool on the platform.

Please refer to FIG. 24 and FIG. 25. FIG. 25 is a partial cross-sectional diagram of the calibrating tool on the platform. The calibrating tool 500 of the present embodiment further includes a handle 530, a supporting stand 540, and plural positioning recesses 550. The handle 530 is disposed on the base 510 for operated by an external device to lift the calibrating tool 500, so the vertical stand 520 will not be touched and tilted. The supporting stand 540 is disposed on the base 620 and is connected to two opposite sides of the vertical stand 520 for providing support to the vertical stand 520 and maintain its verticality, so the vertical stand 520 will not be tilted. The positioning recesses 550 are located on the base 510 and face the platform 410. The positioning recesses 550 share the same structure as the positioning recesses 221 on the bottom portion 220 of the substrate carrier 200 and are used for mating with the positioning pins 460 on the platform 410 to position the calibrating tool 500. Each positioning recess 550 is provided with a pair of positioning ramps 551. Each positioning pin 460 protrudes from the surface 414 of the platform 410. When the calibrating tool 500 is disposed on the platform 410, the positioning pin 460 slides along the positioning ramp 551 to a lock position, so the calibrating tool 500 can be positioned correctly.

According to the above-mentioned embodiments, in the supporting structure and the inspection equipment thereof and the calibrating tool for the inspection equipment, the parallel block is used for restraining the movement of the supporter relative to the supporting portion, so the problems like tilting or shifting of the supporters can be prevented. In some embodiments, the supporter can be further fixed by the stress block and the adjusting block. The supporting structure can be inspected by the inspection equipment prior to practical use of supporting the substrates, so whether the deviation amount of the inspection equipment conforms with the standard or not can be determined. When the deviation of the supporter is inspected, the supporter can be adjusted through the stress block and the adjusting block to achieve the function of calibration. Moreover, standardized calibration can be applied to the inspection equipment to check the specification or size of the inspection equipment.

The ordinal numbers used in the detailed description and claims, such as "first" and "second" do not necessarily indicate their priority orders or up and down directions; on the contrary, they are merely intended to distinguish different members. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A supporting structure for using in a substrate carrier, comprising:

a backbone vertically disposed in the substrate carrier and having a plurality of supporting portions that are equal-distantly arranged on the backbone, wherein a receiving trench is defined between two adjacent supporting portions for receiving a supporter, and each supporting portion is provided with a first limiting portion and the supporter is provided with a second limiting portion corresponding to the first limiting portion; and a plurality of parallel blocks each disposed between the first limiting portion and the second limiting portion to restrain a relative movement of the supporter in the receiving trench to the supporting portion.

2. The supporting structure of claim 1, wherein the first limiting portion and the second limiting portion match with each other and a parallel slot is defined therebetween, and each parallel block is structurally fitted and disposed in the parallel slot.

3. The supporting structure of claim 1, further comprising: a plurality of stress blocks each disposed between the receiving trench and the supporter, wherein each stress block is configured for adjusting a first shifting amount of the supporter in the receiving trench.

4. The supporting structure of claim 3, wherein each stress block comprises: a wedge body and a protruded bump, the wedge body has a clamping surface for pressing against a beveled surface of the supporter, the protruded bump is located at an edge of the clamping surface, and each stress block fixes the supporter via the clamping surface and the protruded bump.

5. The supporting structure of claim 4, wherein a guide angle is provided at a location where the clamping surface connects to the protruded bump, the guide angle matches a contour of a corner of the supporter, thereby having the stress block in close contact with the supporter.

6. The supporting structure of claim 3, further comprising: a first locking member passing through the backbone and locking with the stress block, wherein the first shifting amount of the supporter in a first horizontal direction of the backbone is determined by how much the first locking member locks with the stress block.

7. The supporting structure of claim 1, further comprising: a plurality of adjusting blocks each comprising a trapezoid body which has an upper inclined surface for pressing against the supporter.

8. The supporting structure of claim 7, wherein the adjusting blocks are disposed on a lateral side of the supporting portion, each adjusting block is configured for pressing against the supporter for adjusting a second shifting amount of the supporter.

9. The supporting structure of claim 8, further comprising: a second locking member passing through the backbone and locking with the adjusting block, wherein the second shifting amount of the supporter in a second horizontal direction of the backbone is determined by how much the second locking member locks with the adjusting block.

10. The supporting structure of claim 1, wherein an upper groove and a lower groove are respectively provided on a top end and a bottom end of the backbone, and the supporting structure further comprises:

an upper fixing block at the top end for coupling with the upper groove, the backbone being connected to a top portion of the substrate carrier through the top end and upper fixing block; and a lower fixing block at the bottom end for coupling with the lower groove, the backbone being connected to a bottom portion of the substrate carrier through the bottom end and the lower fixing block.

11. An inspection equipment for inspecting the supporting structure of claim 1 and for using with the substrate carrier, the inspection equipment comprising:

a platform for supporting the substrate carrier;

a moving door movably disposed on the platform for moving toward and away from the substrate carrier; and an inspection member disposed on the moving door, the inspection member comprising an inspection surface for abutting against the supporter and a plurality of inspection regions, wherein a deviation amount of the supporter is inspected by the inspection regions based on how much the moving door travels toward the substrate carrier.

12. The inspection equipment of claim 11, wherein the deviation amount comprises a multi-axial deviation amount of the supporter received in the receiving trench.

13. The inspection equipment of claim 11, wherein the inspection regions comprise a first inspection region and a second inspection region located inside the first inspection region;

wherein when the moving door stops at a first inspection location on the platform, the supporter has a first deviation amount larger than an inspection range; and wherein when the moving door stops at a second inspection location on the platform, the supporter has a second deviation amount smaller than or equal to the inspection range.

14. The inspection equipment of claim 13, wherein the inspection regions further comprise a third inspection region located inside the second inspection region;

wherein when the moving door stops at a third inspection location on the platform, the supporter has a third deviation amount conforms with a calibration condition; and wherein the third deviation amount is smaller than the second deviation amount.

15. The inspection equipment of claim 11, further comprising:

a travel depth indication block disposed on the moving door and configured for indicating an inspection result of the inspection member, wherein the deviation amount of the supporter is indicated by the travel depth indication block based on how much the moving door travels toward the substrate carrier.

16. The inspection equipment of claim 11, further comprising:

a gap detector disposed on the moving door for detecting an oblique state of the substrate carrier.

17. A calibrating tool for calibrating the inspection equipment of claim 11, comprising:

a base sitting on the platform of the inspection equipment; and a vertical stand disposed uprightly on the base and having a plurality of calibration members that are equal-distantly arranged on the vertical stand for abutting against the inspection surface of the inspection member, and the calibration members having a structure which is the same as the supporters, wherein each said supporter is received in the receiving trench, thereby having the supporters equal-distantly disposed on the backbone;

wherein whether the inspection surface conforms with a calibration condition or not is inspected through the inspection regions of the inspection member based on how much the moving door travels toward the calibrating tool.

18. The calibrating tool of claim 17, wherein the inspection regions comprise:

a first inspection region for defining a first deviation amount which is larger than a calibration range;

a second inspection region inside the first inspection region for defining a second deviation amount which is larger than the calibration range; and a third inspection region inside the second inspection region for defining a third deviation amount smaller than or equal to the calibration range, the third deviation amount being smaller than the second deviation amount, and the second deviation amount being smaller than the first deviation amount;

wherein when the inspection surface deviates beyond the calibration range, the moving door stops at a first inspection location or a second inspection location on the platform and thereby indicating that the inspection surface does not meet the calibration condition; when the inspection surface deviates in the calibration range, the moving door stops at a third inspection location on the platform and thereby indicating that the inspection surface conforms with the calibration condition.

19. The calibrating tool of claim 17, further comprising:

a handle disposed on the base for operated by an external device to lift the calibrating tool.

20. The calibrating tool of claim 17, further comprising:

a supporting stand disposed on the base and connecting to two opposite sides of the vertical stand for providing support to the vertical stand.

* * * * *